US011031368B2

(12) United States Patent
Mukohjima

(10) Patent No.: US 11,031,368 B2
(45) Date of Patent: Jun. 8, 2021

(54) BONDING APPARATUS

(71) Applicant: Panasonic Intellectual Property Management Co., Ltd., Osaka (JP)

(72) Inventor: Hitoshi Mukohjima, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 85 days.

(21) Appl. No.: 16/406,093

(22) Filed: May 8, 2019

(65) Prior Publication Data

US 2019/0348393 A1 Nov. 14, 2019

(30) Foreign Application Priority Data

May 14, 2018 (JP) .............................. JP2018-092680
May 14, 2018 (JP) .............................. JP2018-092681
May 14, 2018 (JP) .............................. JP2018-092682
May 14, 2018 (JP) .............................. JP2018-092683
May 14, 2018 (JP) .............................. JP2018-092684
May 14, 2018 (JP) .............................. JP2018-092685

(51) Int. Cl.
*H01L 23/00* (2006.01)
*G06T 7/73* (2017.01)
*G06T 7/00* (2017.01)

(52) U.S. Cl.
CPC .............. *H01L 24/75* (2013.01); *G06T 7/001* (2013.01); *G06T 7/74* (2017.01); *G06T 2207/30148* (2013.01); *H01L 2224/75343* (2013.01); *H01L 2224/75702* (2013.01); *H01L 2224/75753* (2013.01); *H01L 2224/75841* (2013.01)

(58) Field of Classification Search
CPC . G06T 7/74; G06T 7/001; G06T 2207/30148; B32B 41/00; B32B 2041/04; H01L 24/75; H01L 22/12; H01L 21/681; H01L 2224/75343; H01L 2224/75702; H01L 2224/75753
See application file for complete search history.

(56) References Cited

U.S. PATENT DOCUMENTS

2020/0090971 A1* 3/2020 Zhu ........................ G02B 27/10

FOREIGN PATENT DOCUMENTS

JP 2001-176934 6/2001
WO WO-2018019277 A1 * 2/2018 ....... H01L 21/67259

* cited by examiner

Primary Examiner — George R Koch
(74) Attorney, Agent, or Firm — Pearne & Gordon LLP

(57) ABSTRACT

A bonding apparatus includes a movable light guide, a first capture, a second capture, a detector, an aligner, and a mover. When the movable light guide is positioned between a chip and a board, an image of the chip is made incident from a first incident port and emitted from a first emission port, and an image of a bonding position of the board is made incident from a second incident port and emitted from a second emission port. The first capture images the image of the chip emitted from the first emission port. The second capture images the bonding position emitted from the second emission port. The detector detects a relative positional deviation of the chip and the bonding position. The aligner relatively moves a bonding tool and a stage. The mover advances and retreats the movable light guide.

10 Claims, 13 Drawing Sheets

BONDING APPARATUS

BACKGROUND

1. Technical Field

The present disclosure relates to a bonding apparatus for holding a chip by a bonding tool and bonding the chip to a board.

2. Description of the Related Art

In a process of manufacturing a semiconductor device, a bonding process is performed in which a semiconductor chip (hereinafter, simply referred to as a "chip") is bonded to a board by ultrasonic bonding or the like. Since high position accuracy is required for bonding, a method of correcting a positional error during the bonding by image recognition is widely used. As a method of the position correction, a technology is known in which position correction is performed by simultaneously imaging both surfaces including an upper surface of a board and a lower surface of a chip prior to the bonding in a case where the chip that is a target of the bonding is a flip chip having bumps for connection on the lower surface (for example, Japanese Patent Unexamined Publication No. 2001-176934).

In the related art illustrated in the Japanese Patent Unexamined Publication No. 2001-176934, an example is illustrated in which an electrode position observation mechanism which simultaneously observes connection electrodes provided on a chip and a carrier tape in a state of opposing immediately before the bonding is provided in a flip chip bonder used for manufacturing a semiconductor device. In the electrode position observation mechanism, a prism type mirror provided to be retractable is advanced between the chip and the carrier tape, and the image of the chip and the carrier tape reflected on the two reflection surfaces of the prism type mirror is captured by the camera.

However, in the related art illustrated in the Japanese Patent Unexamined Publication No. 2001-176934, there are the following problems in realizing high productivity while ensuring high position accuracy. In other words, in order to improve the productivity in the bonding apparatus, it is required to shorten a tact time by reducing an elevation height of the bonding tool in each bonding operation. However, in the electrode position observation mechanism, since it is necessary to advance the prism type mirror between the chip held by the bonding tool and the carrier tape, a standby height of the bonding tool immediately before the bonding is restricted by a thickness dimension of the prism type mirror. Therefore, it is difficult to shorten the tact time by reducing the elevation height of the bonding tool in each bonding operation resulting in inhibiting the improvement of productivity. As described above, the bonding apparatus of the related art has a problem that it is difficult to realize high productivity while ensuring high position accuracy.

Here, an object of the disclosure is to provide a bonding apparatus capable of realizing high productivity while ensuring high position accuracy.

SUMMARY

According to an aspect of the disclosure, there is provided a bonding apparatus in which a bonding tool holds a chip and the bonding tool is lowered in a direction of a stage on which a board is placed so as to oppose the chip to bond the chip to a bonding position of the board, the bonding apparatus including: a movable light guide which makes an image of the chip incident from a first incident port that opposes the chip and emits the image of the chip upward from a first emission port separated from the first incident port in a horizontal direction, and makes an image of the bonding position of the board incident from a second incident port that opposes the bonding position and emits the image of the bonding position upward from a second emission port separated from the second incident port in the horizontal direction, when being positioned between the chip positioned above the bonding position and the board; a first capture which images the image of the chip emitted from the first emission port; a second capture which images the image of the bonding position emitted from the second emission port; a detector which detects a relative positional deviation of the chip and the bonding position based on the image of the chip imaged by the first capture and the image of the bonding position imaged by the second capture; an aligner which relatively moves the bonding tool and the stage based on the relative positional deviation detected by the detector; and a mover which advances and retreats the movable light guide to a space between the chip positioned above the bonding position and the board.

According to another aspect of the disclosure, there is provided a bonding apparatus in which a bonding tool holds a chip and the bonding tool is lowered in a direction of a stage on which a board is placed so as to oppose the chip to bond the chip to a bonding position of the board, the bonding apparatus including: a movable light guide which makes an image of the chip incident from a first incident port that opposes the chip and emits the image of the chip upward from a first emission port separated from the first incident port in a horizontal direction, and makes an image of the bonding position of the board incident from a second incident port that opposes the bonding position and emits the image of the bonding position upward from a second emission port separated from the second incident port in the horizontal direction, when being positioned between the chip which are positioned above the bonding position and the board; a first capture which images a first partial image which is a part of the image of the chip emitted from the first emission port; a second capture which images a second partial image which is a part that corresponds to the first partial image in the image of the bonding position emitted from the second emission port; a third capture which images a third partial image which is a part different from the first partial image in the image of the chip emitted from the first emission port; a fourth capture which images a fourth partial image which is a part that corresponds to the third partial image in the image of the bonding position emitted from the second emission port; a detector which detects a relative positional deviation of the chip and the bonding position based on the first partial image imaged by the first capture, the second partial image imaged by the second capture, the third partial image imaged by the third capture, and the fourth partial image imaged by the fourth capture; an aligner which relatively moves the bonding tool and the stage based on the relative positional deviation detected by the detector; and a mover which advances and retreats the movable light guide to a space between the chip positioned above the bonding position and the board.

According to the disclosure, it is possible to realize high productivity while ensuring high position accuracy.

DETAILED DESCRIPTION

Figure 1:
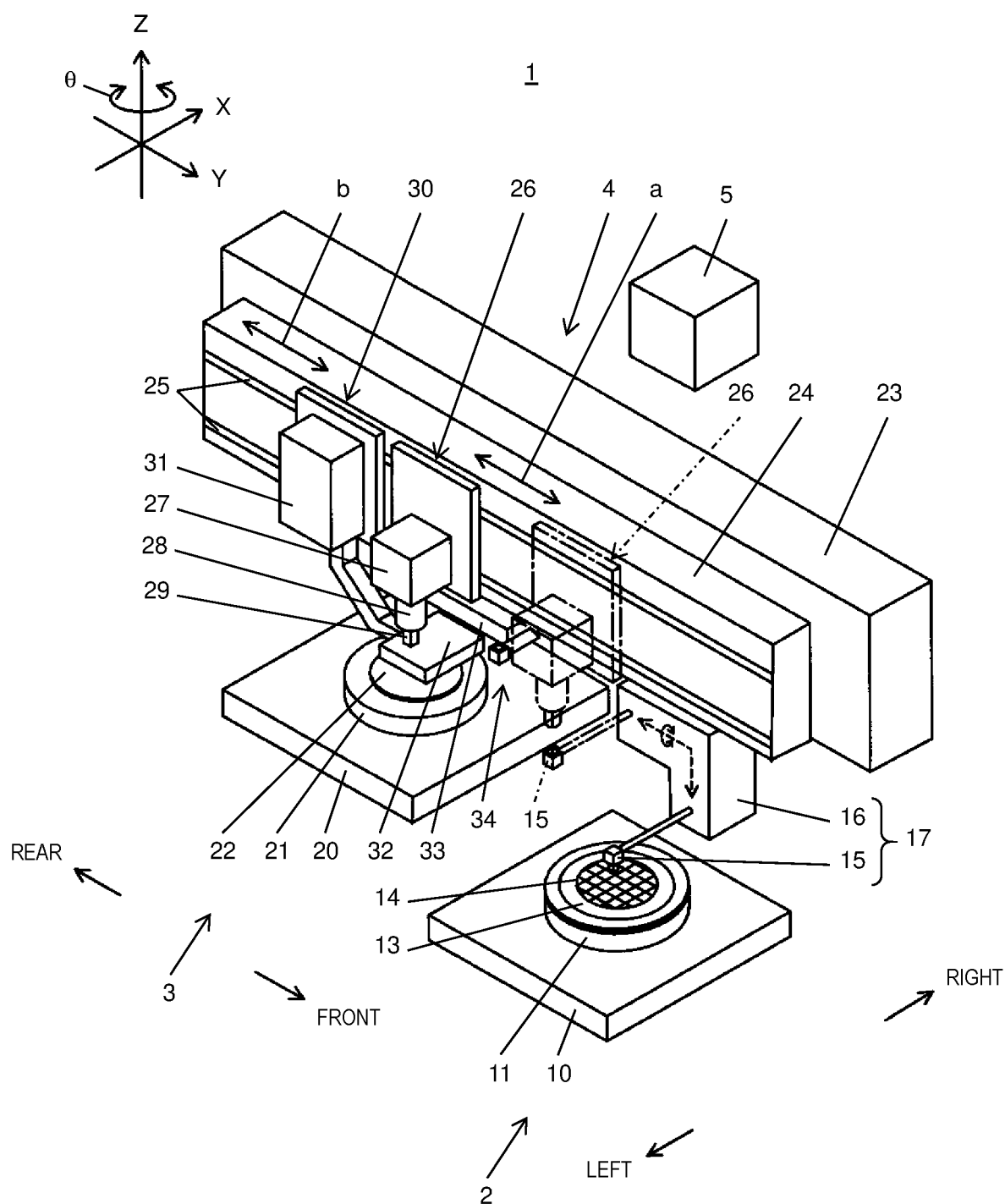
FIG. 1 is a perspective view of a bonding apparatus according to an embodiment of the disclosure.

Next, an embodiment of the disclosure will be described with reference to the drawings. First, a configuration of bonding apparatus 1 having a function of bonding a chip, such as a semiconductor chip, to a bonding position of a board will be described with reference to FIGS. 1, 2, and 3. In FIG. 1, bonding apparatus 1 includes chip supplier 2, board holder 3, bonding mechanism 4, and controller 5 that controls the units.

Figure 2:
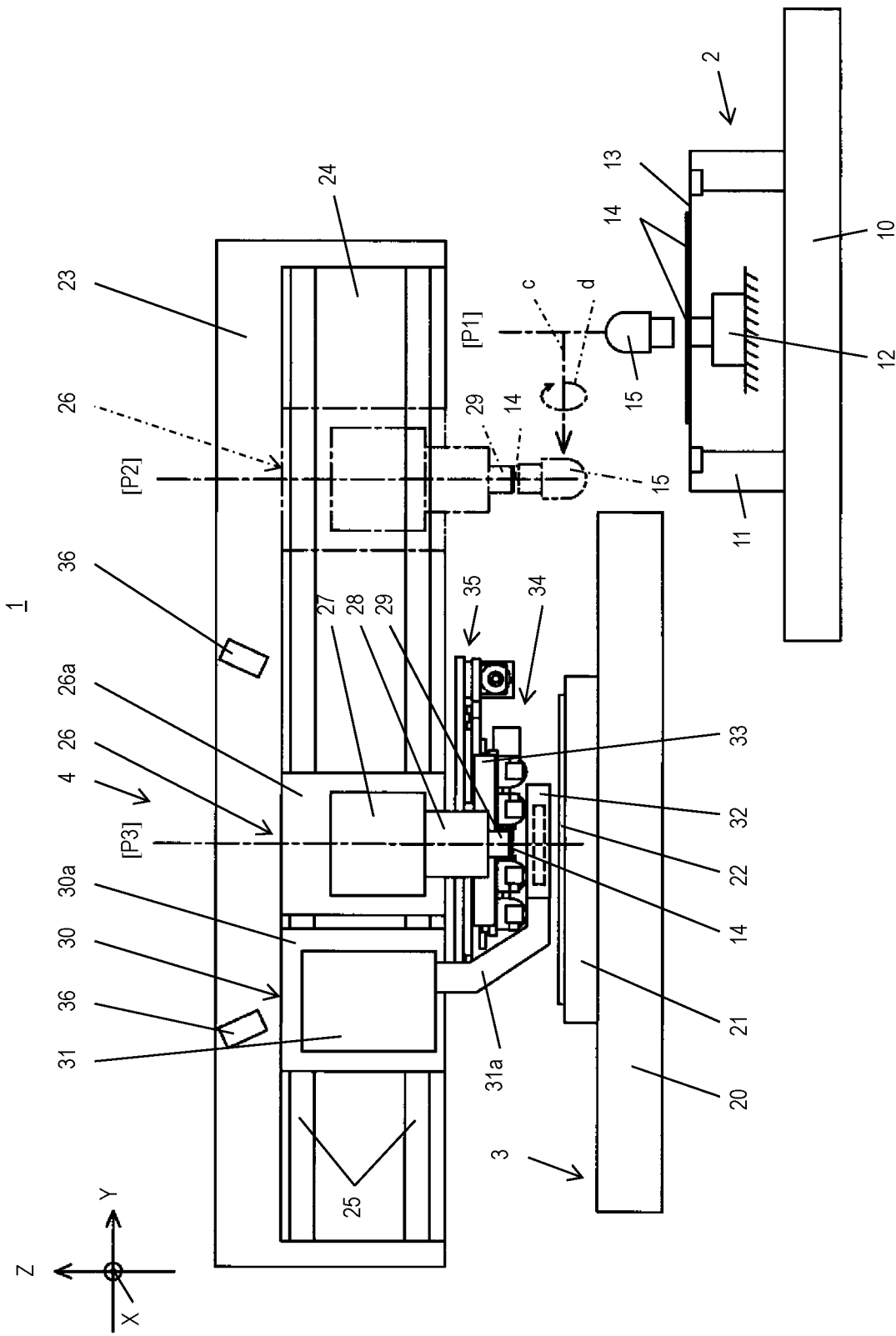
FIG. 2 is a side view of the bonding apparatus according to the embodiment of the disclosure.

Chip supplier 2 has a function of supplying the chip which is a component which is a bonding target. As illustrated in FIG. 2, chip supplier 2 includes supply stage 11 disposed on an upper surface of first XY table 10. Wafer sheet 13 is held in a stretched state on an upper surface of supply stage 11, and chips 14 in a state of being divided into pieces are pasted to an upper surface of wafer sheet 13 in a posture in which an active surface on which bumps are formed is oriented upward. By driving first XY table 10, supply stage 11 moves in X and Y directions, and it is possible to position any chip 14 which is a removal target at removal position [P1].

As illustrated in FIG. 1, pickup head 15 is coupled to a distal end of an arm that has extended from pickup head driver 16. By driving pickup head driver 16, pickup head 15 moves between removal position [P1] of chip 14 above supply stage 11 and delivery position pickup position [P2] to bonding mechanism 4. In picking up chip 14, chip 14 which is a pickup target is peeled off from wafer sheet 13 by operating ejector 12 disposed on the lower surface side of wafer sheet 13. Peeled chip 14 is held by pickup head 15 in a posture in which the active surface is oriented upward.

Pickup head 15 that holds chip 14 at removal position [P1] ascends and moves to pickup position [P2] by bonding head 26 of bonding mechanism 4 (arrow c). During the movement, by reversing pickup head 15 upside down (arrow d), pickup head 15 is in a state of holding chip 14 at pickup position [P2] in a posture in which the active surface is oriented downward. Pickup head 15 and pickup head driver 16 configure chip transferer 17 for transferring chip 14 removed from chip supplier 2 at removal position [P1] to pickup position [P2] by optical head 30.

Next, the configuration of board holder 3 will be described. As illustrated in FIGS. 1 and 2, on an upper surface of second XY table 20, board holding stage 21 that holds board 22 which is the bonding target is disposed. By driving second XY table 20, board holding stage 21 moves in the X and Y directions. Accordingly, it is possible to position bonding position 22a (refer to FIG. 6A) set on board 22 at working position [P3]. Chip 14 is bonded by bonding tool 29 of bonding mechanism 4 described hereinafter to bonding position 22a aligned at working position [P3].

The configuration of bonding mechanism 4 will be described. As illustrated in FIGS. 1 and 2, above chip supplier 2 and board holder 3, Y-axis frame 23 is disposed horizontally in the Y direction. Linear motor 24 with two rows of guide rails 25 is disposed along a side surface in Y-axis frame 23. Guide rail 25 extends horizontally above board holding stage 21 (stage). On guide rail 25, first moving base 26a is movably installed via slider 25a (FIG. 3) along guide rail 25. Furthermore, on guide rail 25, second moving base 30a which is movable along guide rail 25 independently from first moving base 26a is installed.

Bonding head 26 is installed on first moving base 26a. Bonding head 26 is configured to hold bonding tool 29 by bonding tool holder 28 driven by bonding tool driver 27. By driving bonding tool driver 27 in a state where chip 14 is held by bonding tool 29, bonding tool 29 is lowered to bond held chip 14 to bonding position 22a of board 22 (refer to FIG. 6B). In other words, in bonding apparatus 1 illustrated in the embodiment, bonding tool 29 holds chip 14 and lowers bonding tool 29 in the direction of board holding stage 21 on which board 22 is placed so as to oppose chip 14, and work for bonding chip 14 to bonding position 22a of board 22 is performed.

Light source box 31 is installed on second moving base 30a. As illustrated in FIG. 2, movable optical unit 32 incorporating movable prism 32a (refer to FIG. 7) which is a movable light guide, is coupled to arm 31a that has extended downward from the lower part of light source box 31. Here, arm 31a is provided to be bent toward bonding head 26 side, and movable prism 32a is in a mode of being offset from the center of optical head 30 toward bonding head 26 side.

By driving linear motor 24, first moving base 26a and second moving base 30a move along guide rail 25, and accordingly, bonding head 26 and optical head 30 move in the Y direction. Therefore, linear motor 24 and guide rail 25 are movers for moving bonding head 26 and optical head 30.

In other words, the mover moves bonding head 26 between pickup position [P2] at which bonding tool 29 picks up chip 14 and working position [P3] at which chip 14 is bonded, and moves optical head 30 for taking in and out movable optical unit 32 incorporating movable prism 32a to and from working position [P3].

In addition, a function for advancing and retreating movable prism 32a which is a movable light guide incorporated in movable optical unit 32 in the space between chip 14 positioned above bonding position 22a and board 22 by moving optical head 30, is provided. In this manner, by a configuration for operating bonding head 26 and optical head 30 with the same mover, it becomes possible to simplify the mechanism of the bonding apparatus and to reduce equipment cost.

Figure 3:
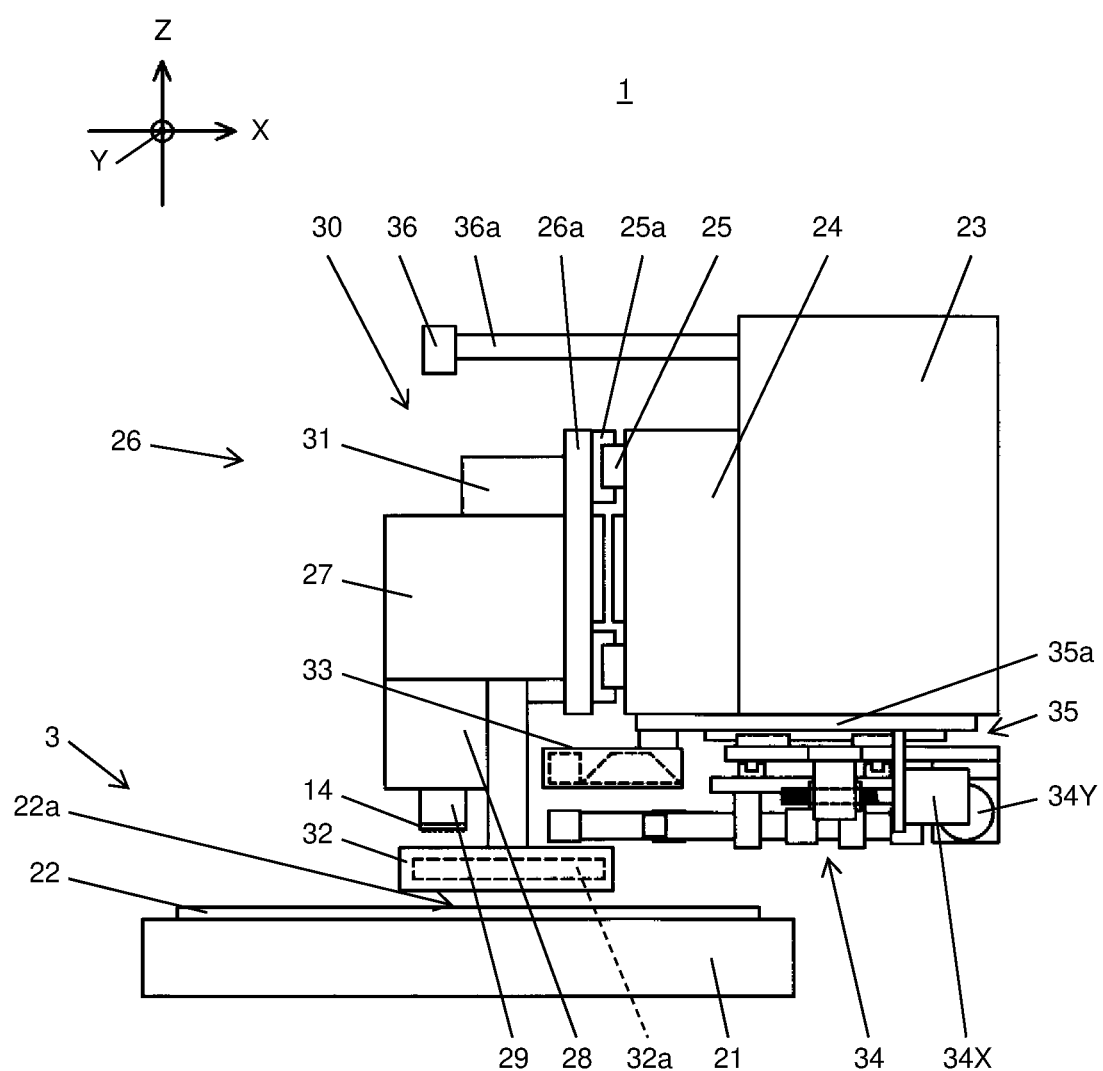
FIG. 3 is a front view of the bonding apparatus according to the embodiment of the disclosure.
Figure 4:
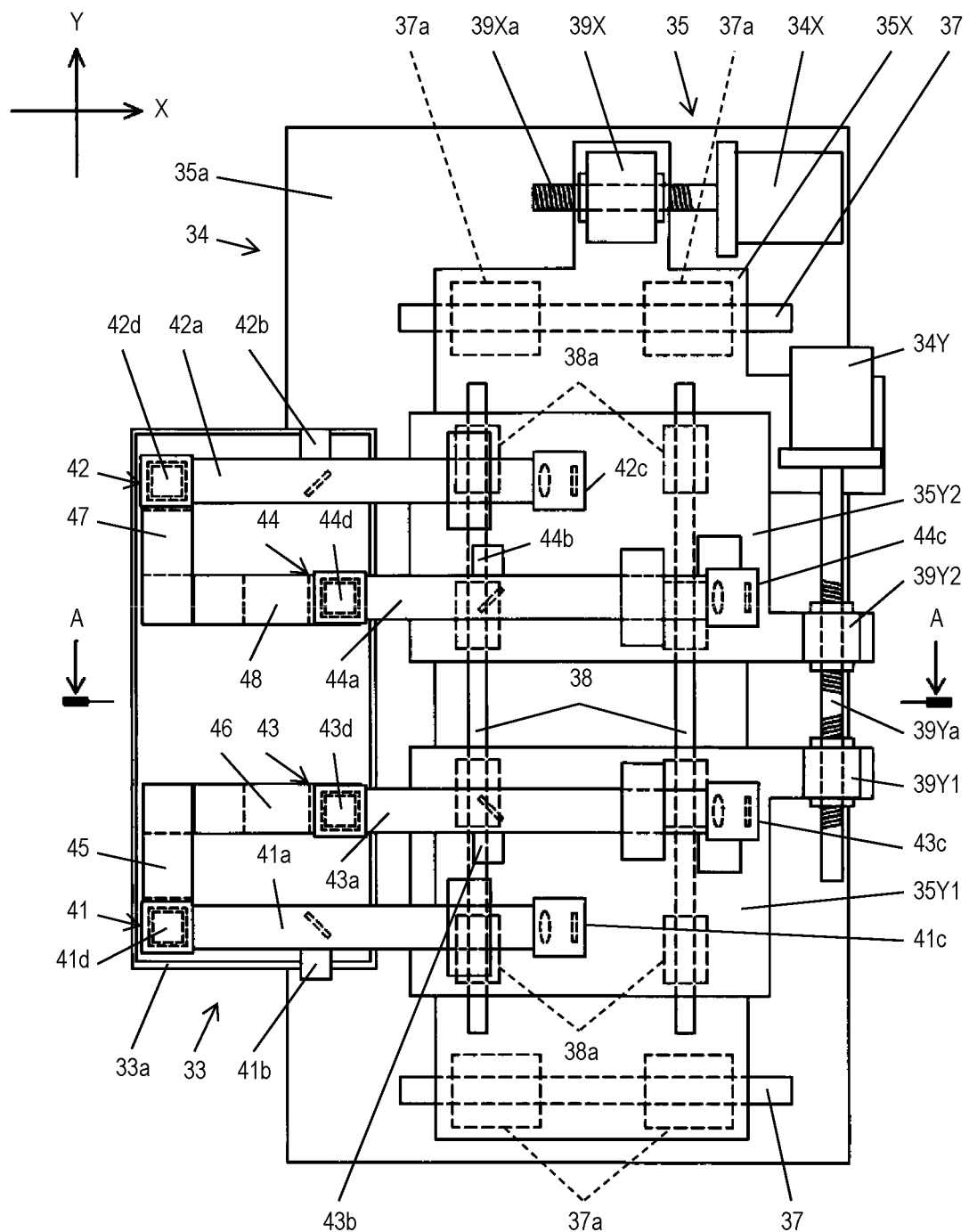
FIG. 4 is a lower view of an imaging unit provided in the bonding apparatus according to the embodiment of the disclosure.
Figure 8:
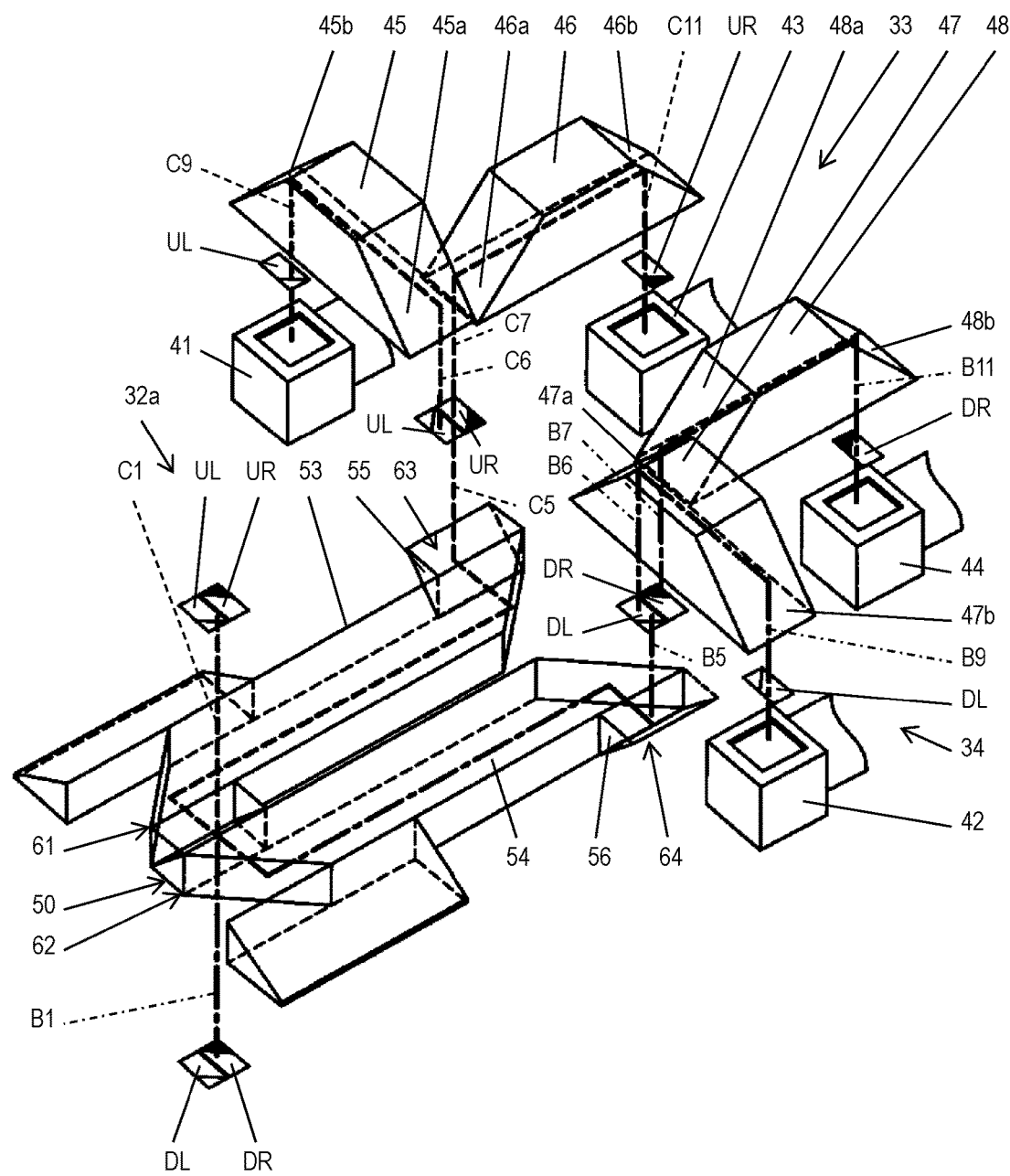
FIG. 8 is an explanatory view of a capture used for imaging a chip and a bonding position by the bonding apparatus according to the embodiment of the disclosure and an imaging visual field to be acquired.
Figure 9A:
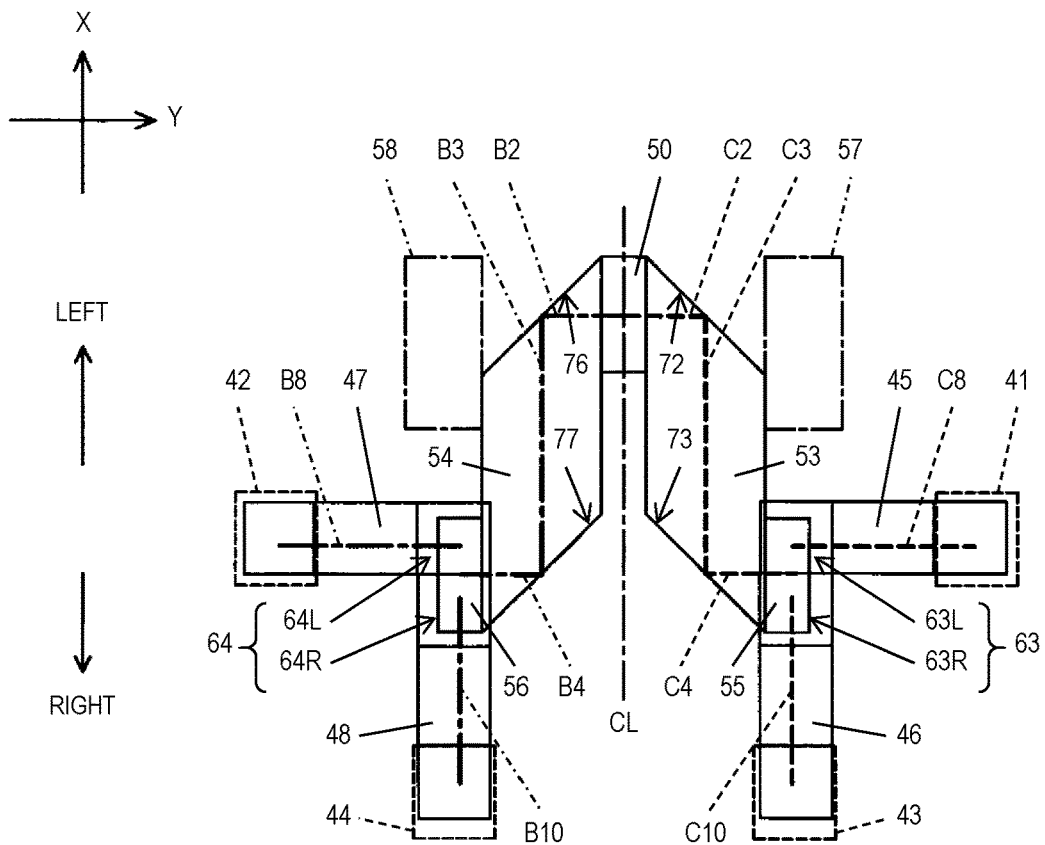
FIG. 9A is an explanatory view of an image acquisition route in imaging the chip and the bonding position by the bonding apparatus according to the embodiment of the disclosure.
Figure 9B:
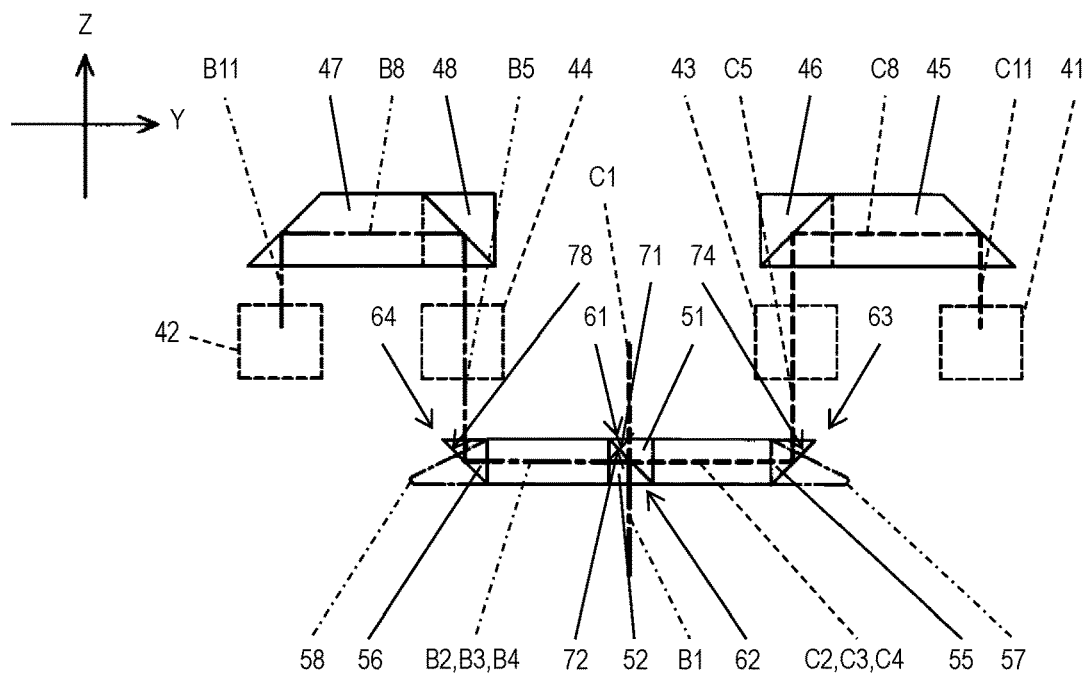
FIG. 9B is an explanatory view of an image acquisition route in imaging the chip and the bonding position by the bonding apparatus according to the embodiment of the disclosure.

As illustrated in FIG. 3, on a lower surface of Y-axis frame 23 and linear motor 24, imaging unit 34 illustrated in FIG. 4 is installed to move freely in the X and Y directions via base 35a of capture moving mechanism 35 which is a capture mover. Imaging unit 34 has four captures individually provided with a camera. Furthermore, on the lower surface of linear motor 24, fixed optical unit 33 incorporating upper left prism 45 (first light guide), upper right prism 46 (third light guide), lower left prism 47 (second light guide), a lower right prism 48 (fourth light guide) which are illustrated in FIGS. 8, 9A, and 9B, is disposed. In the embodiment, by combining imaging unit 34 with movable optical unit 32 that advances and retreats between chip 14 and board 22, chip 14 and board 22 are imaged by imaging unit 34.

As illustrated in FIGS. 2 and 3, above Y-axis frame 23, a pair of spot illuminations 36 is disposed in a disposition in which working position [P3] is sandwiched from both sides. Spot illumination 36 is held at a distal end of holding bracket 36a that has extended from Y-axis frame 23, and is disposed in a posture in which an irradiation direction is directed to movable optical unit 32 positioned at working position [P3]. The illumination light emitted from spot illumination 36 becomes incident on movable prism 32a in movable optical unit 32, and is emitted to bonding position 22a of board 22 (refer to FIG. 12). In other words, spot illumination 36 is an illuminator that irradiates board 22 with illumination light from above.

Figure 5:
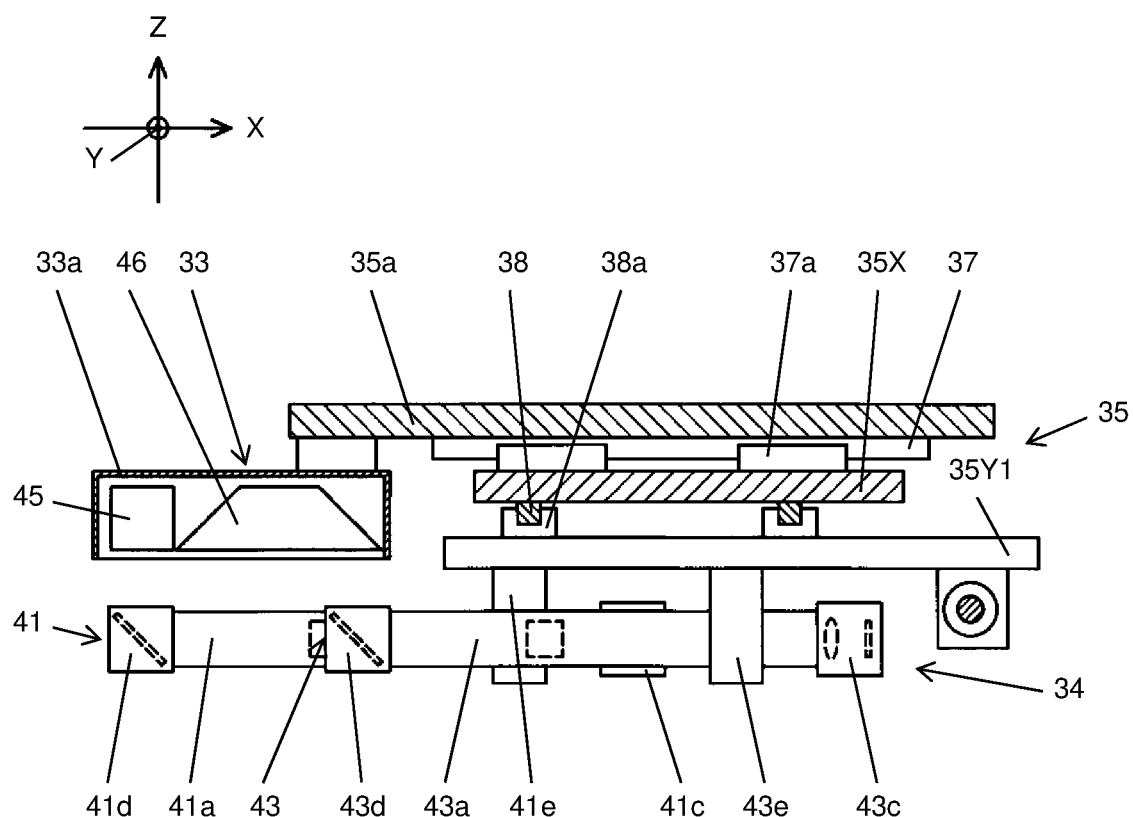
FIG. 5 is a sectional view of the imaging unit provided in the bonding apparatus according to the embodiment of the disclosure.

Next, with reference to FIGS. 4 and 5, the structure of imaging unit 34 and capture moving mechanism 35 for moving imaging unit 34 will be described. FIG. 4 illustrates a lower surface of imaging unit 34 illustrated in FIG. 3, and FIG. 5 illustrates an A-A section in FIG. 4. Base 35a illustrated in FIG. 4 is a rectangular base plate, and is installed on the lower surface of Y-axis frame 23 and linear motor 24 (refer to FIG. 3). In other words, in the embodiment, the first capture and the second capture (refer to the description in FIG. 8) that configure imaging unit 34 are installed on the lower surface of linear motor 24 or Y-axis frame 23 that supports linear motor 24. In addition, linear motor 24 is a mover for moving bonding head 26 and optical head 30.

The configuration of capture moving mechanism 35 will be described. Slider 37a fixed to a substantially rectangular X-direction moving table 35X is slidably fitted to a pair of guide rails 37 arranged in the X direction at both ends of base 35a in the Y direction. X-axis nut member 39X is disposed in a protrusion provided at the end on one side in the Y direction of X-direction moving table 35X. Feed screw 39Xa which is rotationally driven by imaging unit X-axis motor 34X, is screwed into X-axis nut member 39X. By driving imaging unit X-axis motor 34X forward and reverse, X-direction moving table 35X reciprocates in the X direction. Imaging unit X-axis motor 34X, X-axis nut member 39X, and feed screw 39Xa configure a first moving mechanism included in capture moving mechanism 35.

A plurality of sliders 38a fixed to first Y-direction moving table 35Y1 and second Y-direction moving table 35Y2 are slidably fitted to a pair of guide rails 38 disposed on X-direction moving table 35X. In each of first Y-direction moving table 35Y1 and second Y-direction moving table 35Y2, first Y-axis nut member 39Y1 and second Y-axis nut member 39Y2 are respectively disposed in the protrusion provided at the end on one side in the X direction. Feed screw 39Ya which is rotationally driven by imaging unit Y-axis motor 34Y, is screwed into first Y-axis nut member 39Y1 and second Y-axis nut member 39Y2.

Here, in a feed groove formed in feed screw 39Ya, a pitch direction becomes opposite between a range screwed to first Y-axis nut member 39Y1 and a range screwed to second Y-axis nut member 39Y2. By driving imaging unit Y-axis motor 34Y forward and reverse, first Y-direction moving table 35Y1 and second Y-direction moving table 35Y2 move in a direction of approaching and being separated from the Y direction. Imaging unit Y-axis motor 34Y, first Y-axis nut member 39Y1, second Y-axis nut member 39Y2, and feed screw 39Ya configure a second moving mechanism included in capture moving mechanism 35.

In the above-described configuration, since first Y-direction moving table 35Y1 and second Y-direction moving table 35Y2 are disposed fixed to X-threction moving table 35X, by moving the above-described first moving mechanism, first Y-direction moving table 35Y1 and second Y-direction moving table 35Y2 move in the same direction by the same distance. Further, by driving the above-described second moving mechanism, it is possible to move first Y-direction moving table 35Y1 and second Y-direction moving table 35Y2 in opposite directions by the same distance.

On first Y-direction moving table 35Y1 and second Y-direction moving table 35Y2, upper left capture 41 (first capture), upper right capture 43 (third capture), lower left capture 42 (second capture), and lower right capture 44 (fourth capture) which respectively configure imaging unit 34, are arranged in the X direction.

Here, the configuration of the capture that configures imaging unit 34 will be described. The captures are configured such that an incident part and a camera are installed on both ends of a cylindrical mirror tubular part, and the same axis illumination is disposed on a side surface of the mirror tubular part positioned between the incident part and the camera. In the configuration, an image of an imaging target incident on the incident part in a perpendicular direction is transmitted in the mirror tubular part in a horizontal direction and is incident on the camera, and accordingly an image of the imaging target is acquired. At this time, the illumination light by the same axis illumination is emitted by a half mirror along the imaging optical axis in a direction toward the imaging target, and becomes incident on the imaging target from the same axis direction.

Specifically, upper left capture 41 which is the first capture has upper left mirror tubular part 41a, upper left same axis illumination 41b, upper left camera 41c which is a first camera, and upper left incident part 41d, and upper right capture 43 which is the third capture has upper right mirror tubular part 43a, upper right same axis illumination 43b, upper right camera 43c which is a third camera, and upper right incident part 43d. Similarly, lower left capture 42 which is the second capture includes lower left mirror tubular part 42a, lower left same axis illumination 42b, lower left camera 42c which is a second camera, and lower left incident part 42d, and lower right capture 44 includes mirror tubular part 44a, lower right same axis illumination 44b, lower right camera 44c which is a fourth camera, and lower right incident part 44d.

As illustrated in the example of upper left capture 41 and upper right capture 43 in FIG. 5, upper left mirror tubular part 41a and upper right mirror tubular part 43a are held by holding brackets 41e and 43e coupled to the lower surface of first Y-direction moving table 35Y1. Fixed optical unit 33 fixed to base 35a is positioned above upper left incident part 41d and upper right incident part 43d. Fixed optical unit 33 has a configuration in which upper left prism 45, upper right prism 46, lower left prism 47, and lower right prism 48 are incorporated inside storage 33a. Upper left prism 45, upper right prism 46, lower left prism 47, and lower right prism 48 have a function of internally reflecting the image incident from incident edges 45a, 46a, 47a, and 48a, and emitting the reflected image from emission edges 45b, 46b, 47b, and 48b from below (refer to FIG. 8).

Fixed optical unit 33 has a function of dividing the upper and lower two-visual field images of chip 14 and bonding position 22a captured by movable optical unit 32 which will be described below into two left and right chip images and two left and right bonding position images and transmitting the images to the above-described four captures. In other words, upper left capture 41, lower left capture 42, upper right capture 43, and lower right capture 44 are aligned such that upper left incident part 41d, lower left incident part 42d, upper right incident part 43d, and lower right incident part 44d are respectively positioned below emission edges 45b, 47b, 46b and 48b illustrated in FIG. 8. The alignment is performed using the function of the above-described capture moving mechanism 35.

In other words, capture moving mechanism 35 which is a capture mover moves upper left capture 41 (first capture), lower left capture 42 (second capture), upper right capture 43 (third capture), and lower right capture 44 (fourth capture) relatively to upper left prism 45 (first light guide), lower left prism 47 (second light guide), upper right prism 46 (third light guide), and lower right prism 48 (fourth light guide). Accordingly, upper left incident part 41d, lower left incident part 42d, upper right incident part 43d, and lower right incident part 44d are aligned with emission edges 45b, 47b, 46b, and 48b.

Figure 6A:
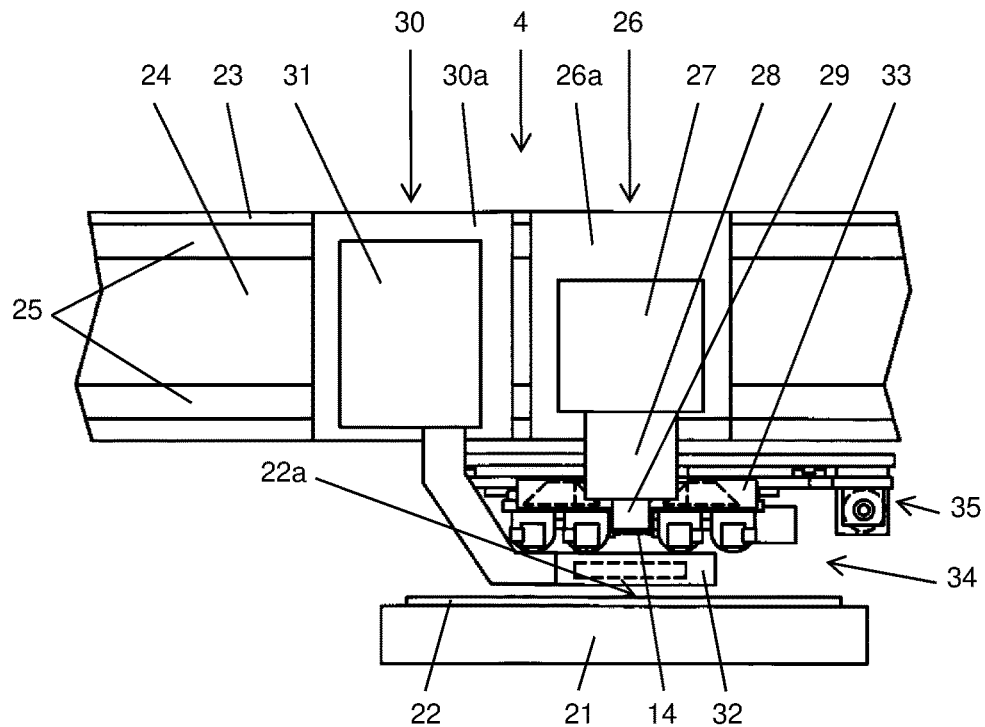
FIG. 6A is an operation explanatory view of the bonding apparatus according to the embodiment of the disclosure.
Figure 6B:
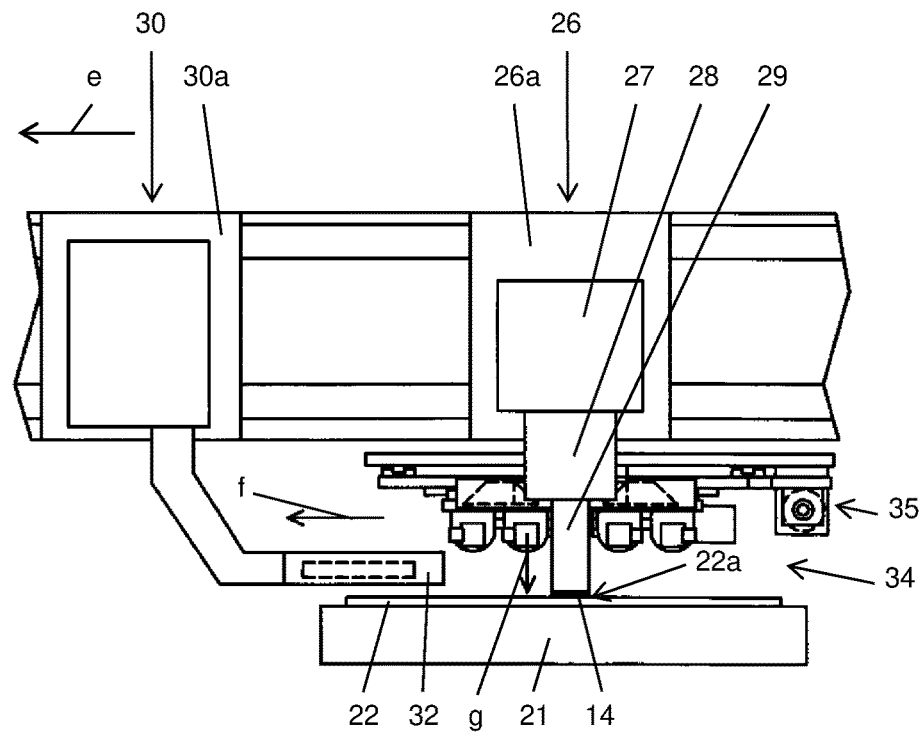
FIG. 6B is an operation explanatory view of the bonding apparatus according to the embodiment of the disclosure.

FIGS. 6A and 6B illustrate vertically two-direction recognition in a bonding operation executed in bonding apparatus 1 and the bonding operation executed following the vertically two-direction recognition. In other words, prior to the execution of the bonding operation, as illustrated in FIG. 6A, bonding tool 29 that holds chip 14 is positioned above bonding position 22a, and movable optical unit 32 is advanced between bonding position 22a and chip 14.

Here, movable optical unit 32 is in a mode of being offset from the center of optical head 30 toward bonding head 26 side. Therefore, optical head 30 can position movable optical unit 32 between bonding position 22a and chip 14 without causing interference between optical head 30 and bonding head 26. Imaging and position recognition of chip 14 and bonding position 22a by imaging unit 34 are performed in this state. The image of chip 14 and bonding position 22a incident on movable optical unit 32 is incident on imaging unit 34 via fixed optical unit 33 fixed above (refer to FIG. 8).

When imaging and position recognition for one chip 14 are finished, as illustrated in FIG. 6B, optical head 30 is moved in a retreating direction (arrow e). Accordingly, movable optical unit 32 retreats from between bonding position 22a and chip 14 (arrow f), and the space between bonding position 22a and chip 14 becomes free. In addition, in this state, by driving bonding tool driver 27 to lower bonding tool 29 (arrow g), bonding head 26 bonds chip 14 held by bonding tool 29 to bonding position 22a of board 22.

At this time, the alignment of chip 14 with bonding position 22a is performed by reflecting the above-described position recognition result. In the position recognition, chip 14 and bonding position 22a are simultaneously imaged immediately before installing chip 14 so as to detect the relative positional deviation of chip 14 and bonding position 22a. Accordingly, it becomes possible to detect positional deviation state with high accuracy, and to ensure bonding result with high accuracy.

Next, with reference to FIG. 7, the configuration and function of movable prism 32a incorporated in movable optical unit 32 will be described. As described above, movable optical unit 32 is capable of advancing and retreating between chip 14 and board 22. Movable prism 32a has a function of transmitting the image of chip 14 and the image of bonding position 22a to fixed optical unit 33 positioned above when being positioned between chip 14 positioned above bonding position 22a of board 22 and board 22.

Figure 7:
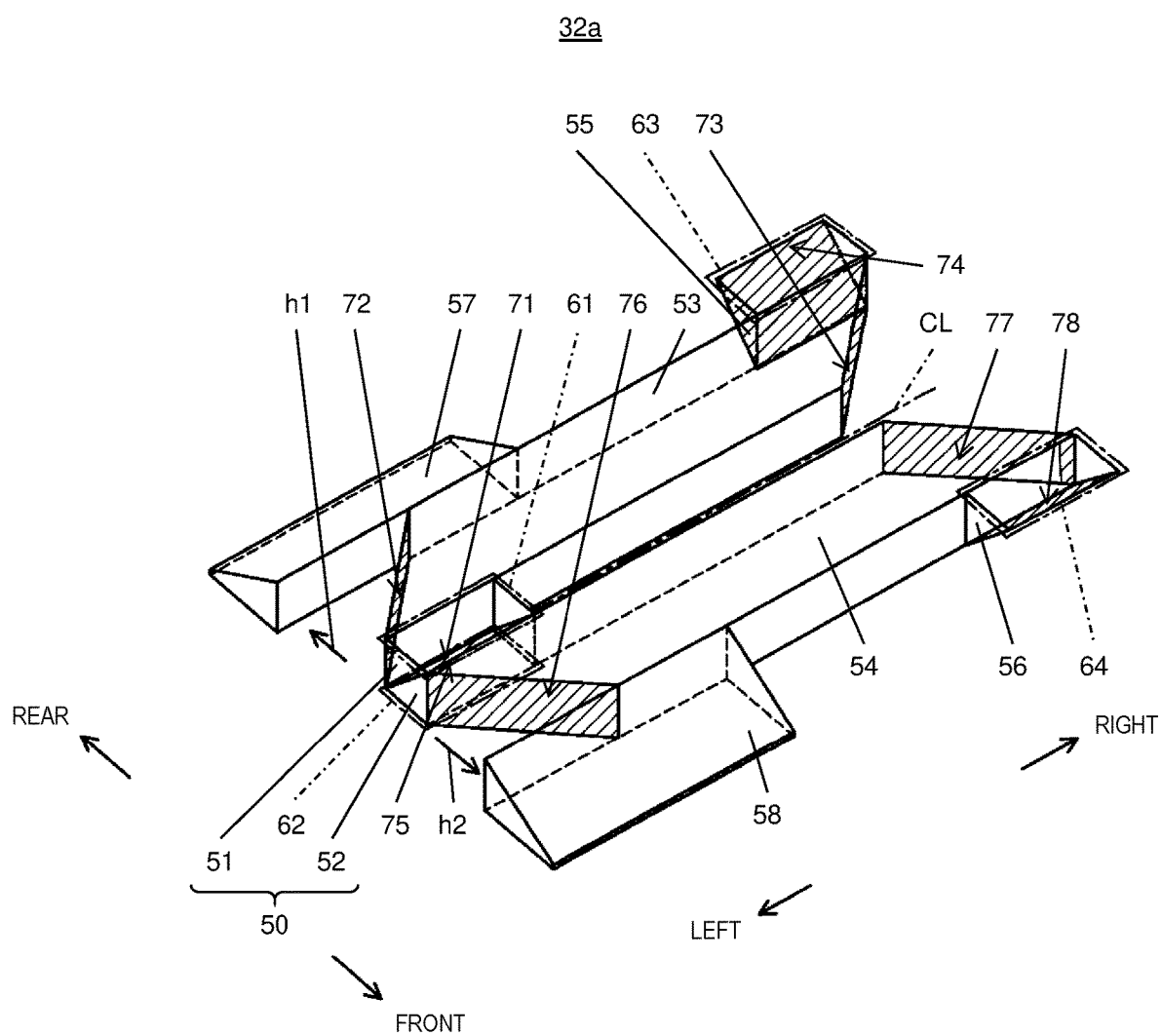
FIG. 7 is a perspective view illustrating a configuration of a movable light guide in the bonding apparatus according to the embodiment of the disclosure.

In FIG. 7, movable prism 32a is a multi-surface reflection prism made of light transmitting members, and has a prism body in which the ends on acute angle sides of a pair of substantially rhombic first block body 53 (first light guide) and second block body 54 (second light guide) are coupled to each other via rectangular parallelepiped reflector 50 as a main body. Reflector 50 has a configuration in which oblique sides of first light guide 51 and second light guide 52 in a shape of a right-angled triangular prism are aligned and coupled to each other, and the upper surface and the lower surface of the coupled surface function as a reflection surface (first reflection surface 71, fifth reflection surface 75) that reflects the light. The oblique surfaces provided at the left and right ends of first block body 53 and second block body 54 function as reflection surfaces (second reflection surface 72, third reflection surface 73, sixth reflection surface 76, seventh reflection surface 77) which reflect the light inside the members.

The upper surface of first light guide 51 and the lower surface of second light guide 52 are respectively first incident port 61 and second incident port 62 for making the images which are the imaging targets incident. When movable prism 32a is positioned between chip 14 and board 22, reflector 50 is aligned so as to be positioned between chip 14 and board 22. In this state, first incident port 61 and second incident port 62 are respectively at positions opposing bonding positions 22a (refer to FIG. 6A) of chip 14 and board 22.

On the outer surface of the end on the right side of first block body 53 and second block body 54, fifth light guide 55 and sixth light guide 56 which are in a shape of a right-angled triangular prism are respectively provided in a posture in which one right-angled surface is the same surface as the upper surfaces of first block body 53 and second block body 54. The oblique surfaces of fifth light guide 55 and sixth light guide 56 function as reflection surfaces (fourth reflection surface 74, eighth reflection surface 78) that reflect the light incident from first block body 53 and second block body 54 sides upward. In addition, the upper surfaces of fifth light guide 55 and sixth light guide 56 become first emission port 63 and second emission port 64 for emitting the reflected light. Here, first emission port 63 and second emission port 64 are provided at positions separated in the horizontal direction from first incident port 61 and second incident port 62.

Furthermore, on the outer surface of the end on the left side of first block body 53 and second block body 54, seventh light guide 57 and eighth light guide 58 which are in a shape of a right-angled triangular prism are respectively provided in a posture in which one right-angled surface is the same surface as the lower surfaces of first block body 53 and second block body 54. Seventh light guide 57 and eighth light guide 58 have a function of guiding the illumination light emitted from spot illumination 36 described above to bonding position 22a.

The details of the function of movable prism 32a in imaging chip 14 and bonding position 22a will be described. When movable prism 32a is positioned between chip 14 and board 22, the image of chip 14 is made incident from first incident port 61 that opposes chip 14 and the image of bonding position 22a is made incident from second incident port 62 that opposes bonding position 22a.

In addition, the image of chip 14 incident from first incident port 61 is reflected by first reflection surface 71 of reflector 50 in the first horizontal direction (arrow h1). At the same time, the image of bonding position 22a incident from second incident port 62 is reflected by fifth reflection surface 75 of reflector 50 in the second horizontal direction (arrow h2) opposite to the first horizontal direction (also refer to FIG. 9B).

Next, the image of chip 14 reflected in the first horizontal direction is sequentially reflected by the plurality of chip image reflection surfaces (second reflection surface 72, third reflection surface 73, and fourth reflection surface 74), and guides the image to first emission port 63. At the same time, the image of bonding position 22a reflected in the second horizontal direction is sequentially reflected by the plurality of board image reflection surfaces (sixth reflection surface 76, seventh reflection surface 77, and eighth reflection surface 78), and guides the image to second emission port 64.

The above-described plurality of chip image reflection surfaces provided on first block body 53 includes first final reflection surface (fourth reflection surface 74) and at least one first upright reflection surface (second reflection surface 72, third reflection surface 73), and the first final reflection surface is disposed immediately below first emission port 63, and reflects the image of chip 14 incident horizontally immediately above the image. The first upright reflection surface guides the image of chip 14 reflected in the horizontal direction by first reflection surface 71 to first final reflection surface.

In addition, the above-described board image reflection surface provided in second block body 54 includes second final reflection surface (eighth reflection surface 78) and at least one second upright reflection surface (sixth reflection surface 76, seventh reflection surface 77). Further, the second final reflection surface is disposed immediately below second emission port 64, and reflects the image of bonding position 22a incident horizontally immediately above the image. The second upright reflection surface guides the image of bonding position 22a reflected in the horizontal direction by fifth reflection surface 75 to second final reflection surface.

In movable prism 32a having the above-described configuration, first block body 53 and second block body 54, first final reflection surface (fourth reflection surface 74) and second final reflection surface (eighth reflection surface 78), and first upright reflection surface (second reflection surface 72, third reflection surface 73) and the second upright reflection surface (sixth reflection surface 76, seventh reflection surface 77) pass through the center of reflector 50 and become axisymmetrical with reference to a straight line (center line CL) orthogonal to the first horizontal direction (arrow h1) and the second horizontal direction (arrow h2) within a horizontal surface.

When summarizing the function of movable prism 32a described above, when movable prism 32a is positioned between chip 14 and board 22 which are positioned above bonding position 22a, the image of chip 14 is made incident from first incident port 61 that opposes chip 14. In addition, the movable prism 32a emits the image of chip 14 incident from first incident port 61 upward from first emission port 63 separated in the horizontal direction from the first incident port 61. At the same time, movable prism 32a makes the image of bonding position 22a of board 22 incident from second incident port 62 that opposes bonding position 22a. In addition, movable prism 32a has a function of emitting the image of bonding position 22a incident from second incident port 62 upward from second emission port 64 separated in the horizontal direction from second incident port 62.

In this manner, by using movable prism 32a having a configuration illustrated in the embodiment as a movable light guide used for simultaneously recognizing the upper and lower two-visual fields by advancing and retreating between chip 14 held by bonding tool 29 and bonding position 22a of board 22, the following effects can be obtained. First, since movable prism 32a is configured by combining the prisms of first block body 53, second block body 54 and the like, it is possible to make the thickness dimension of the entire shape of movable optical unit 32 extremely thin, and it becomes possible to reduce the weight.

Therefore, in the imaging operation illustrated in FIG. 6A, it becomes possible to set a standby height at which bonding tool 29 that holds chip 14 is on standby to be extremely low. Accordingly, in the bonding operation illustrated in FIG. 6B, it becomes possible to reduce the bonding operation stroke in which bonding tool 29 ascends and descends, and the operation tact time is shortened. Additionally, in the advancing and retreating operation for advancing and retreating movable optical unit 32, since the weight reduction is achieved, the high-speed operation becomes possible, and further shortening of the operation tact time is realized.

In addition, in the embodiment, an example is illustrated in which movable prism 32a using the multi-surface reflection prism is used as the movable light guide, but the disclosure is not limited to movable prism 32a. In other words, as long as the above-described function can be realized, a movable light guide may be configured by incorporating a reflector, such as a mirror, or an optical element, such as a lens.

Further, in the embodiment, a configuration is adopted in which first emission port 63 and second emission port 64 are disposed at positions separated in the horizontal direction from first incident port 61 and second incident port 62, but the disclosure is not limited to such a configuration. In other words, a take-out part between movable prism 32a and fixed optical unit 33 and imaging unit 34 may be set such that the image of chip 14 captured from first incident port 61 and second incident port 62 and the image of bonding position 22a can be transmitted to upper left capture 41 (first capture), lower left capture 42 (second capture), upper right capture 43 (third capture), and lower right capture 44 (fourth capture).

Next, the imaging visual field and the imaging path when imaging chip 14 and bonding position 22a by imaging unit 34 using the combination of movable prism 32a and fixed optical unit 33 configured as described above will be described with reference to FIGS. 8, 9A, and 9B. In FIG. 8, upper left image UL and upper right image UR illustrated above reflector 50 of movable prism 32a indicate the image of chip 14 which is the imaging target. In addition, lower left image DL and lower right image DR illustrated below reflector 50 indicate the image of bonding position 22a which is the imaging target. In addition, C1 to C11 indicated by thick broken lines indicate paths of imaging in which the image of chip 14 is guided to imaging unit 34. Further, B1 to B11 indicated by thick one-dot chain lines indicate paths of imaging in which the image of bonding position 22a is guided to imaging unit 34.

Here, upper left image UL corresponds to a first partial image which is a part (left half) of the image of chip 14, and upper right image UR corresponds to a third partial image which is a part (right half) different from the first partial image of the image of chip 14. In addition, lower left image DL corresponds to a second partial image which is a part (left half) that corresponds to first partial image of image of bonding position 22a, and lower right image DR corresponds to a fourth partial image which is a part (right half) that corresponds to the third partial image of the image of bonding position 22a. Here, "correspond" means that the imaging visual fields when acquiring the partial images are in a state of vertically overlapping each other.

Upper left image UL and upper right image UR of chip 14 are incident on first incident port 61 of the upper surface of reflector 50 (path C1), guided into first block body 53, and emitted upward from first emission port 63 on the upper surface of fifth light guide 55 (path C5). Lower left image DL and lower right image DR of bonding position 22a are incident on second incident port 62 on the lower surface of reflector 50 (path B1), guided into second block body 54, and emitted upward from second emission port 64 on the upper surface of sixth light guide 56 (path B5).

As illustrated in FIG. 9A, in first block body 53, the image (path C2) of chip 14 incident from reflector 50 is incident on second reflection surface 72 and reflected in the X direction (path C3), and further, the image is incident on third reflection surface 73 and reflected in the Y direction (path C4). Then, the image is incident on fourth reflection surface 74 of fifth light guide 55 and reflected upward (FIG. 9B), and reaches first emission port 63. In addition, in second block body 54, the image (path B2) of bonding position 22a incident from reflector 50 is incident on sixth reflection surface 76 and reflected in the X direction (path B3), and further, the image is incident on seventh reflection surface 77 and reflected in the Y direction (path B4). Then, the image is incident on eighth reflection surface 78 of sixth light guide 56 and reflected upward (FIG. 9B), and reaches second emission port 64.

Incident edge 45a of upper left prism 45 and incident edge 46a of the upper right prism 46 are positioned above fifth light guide 55, and incident edge 47a of lower left prism 47 and incident edge 48a of lower right prism 48 are positioned above sixth light guide 56 (refer to FIG. 8). Here, upper left prism 45, upper right prism 46, incident edge 45a, and incident edge 46a are disposed so as to be respectively positioned above first left emission port 63L and first right emission port 63R obtained by dividing first emission port 63 on the upper surface of fifth light guide 55 into two in the left and right directions. In addition, lower left prism 47, lower right prism 48, incident edge 47a, and incident edge 48a are disposed so as to be respectively positioned above second left emission port 64L and second right emission port 64R obtained by dividing second emission port 64 on the upper surface of sixth light guide 56 into two in the left and right directions.

According to such a configuration, each of the four partial images obtained by dividing the image of chip 14 and the image of bonding position 22a into left and right parts two by two can be captured by the four captures that configure imaging unit 34. In other words, among the images of chip 14 emitted from first emission port 63, upper left image UL emitted from first left emission port 63L and upper right image UR emitted from first right emission port 63R are respectively incident on incident edge 45a of upper left prism 45 and incident edge 46a of upper right prism 46 (paths C6 and C7).

In addition, upper left image UL and upper right image UR which are respectively incident on incident edge 45a of upper left prism 45 and incident edge 46a of upper right prism 46 are respectively reflected to emission edge 45b and emission edge 46b sides in upper left prism 45 and upper right prism 46 (refer to paths C8 and C10 illustrated in FIGS. 9A and 9B), and here, the images are reflected downward and made incident on upper left capture 41 and upper right capture 43 (paths C9 and C11).

In addition, among the images of bonding position 22a emitted from second emission port 64, lower left image DL emitted from second left emission port 64L and lower right image DR emitted from second right emission port 64R are respectively incident on incident edge 47a of lower left prism 47 and incident edge 48a of lower right prism 48 (paths B6 and B7). Further, lower left image DL and lower right image DR which are respectively incident on incident edge 47a of lower left prism 47 and incident edge 48a of lower right prism 48 are respectively reflected to emission edge 47b and emission edge 48b sides in lower left prism 47 and lower right prism 48 (refer to paths B8 and B10 illustrated in FIGS. 9A and 9B), and here, the images are reflected downward and made incident on lower left capture 42 and lower right capture 44 (paths B9 and B11).

In the above-described configuration, upper left capture 41 images the first partial image (upper left image UL) which is a part of the image of chip 14 emitted from first emission port 63, and lower left capture 42 images the second partial image (lower left image DL) which is a part that corresponds to the first partial image (upper left image UL) of the image of bonding position 22a emitted from second emission port 64. In addition, upper right capture 43 images the third partial image (upper right image UR) which is a part different from the first partial image (upper left image UL) of the image of chip 14 emitted from first emission port 63, and lower right capture 44 images the fourth partial image (DR) that corresponds to the third partial image (upper right image UR) of the image of bonding position 22a emitted from second emission port 64.

Furthermore, specifically, fixed optical unit 33 provided in bonding apparatus 1 includes first light guide (upper left prism 45), second light guide (lower left prism 47), third light guide (upper right prism 46), and fourth light guide (lower right prism 48). The first light guide makes the first partial image (upper left image UL) which is a part of the image of chip 14 emitted from first emission port 63 incident and emitted. The second light guide makes the second partial image (lower left image DL) which is a part of the image of bonding position 22a emitted from second emission port 64 incident and emitted. The third light guide makes the third partial image (upper right image UR) which is a part different from the first partial image (upper left image UL) of the image of chip 14 emitted from first emission port 63 incident and emitted. The fourth light guide makes the fourth partial image (lower right image DR) which is a part different from the second partial image (lower left image DL) of the image of bonding position 22a emitted from second emission port 64 incident and emitted.

In addition, upper left capture 41 images the first partial image (upper left image UL) emitted from the first light guide (upper left prism 45), and lower left capture 42 images the second partial image (lower left image DL) emitted from second light guide (lower left prism 47). Further, upper right capture 43 images the third partial image (upper right image UR) emitted from the third light guide (upper right prism 46), and lower right capture 44 images the fourth partial image (lower right image DR) emitted from fourth light guide (lower right prism 48).

In imaging chip 14 and bonding position 22a by imaging unit 34 having the above-described configuration, there is a case where it is necessary to adjust the position of the imaging visual field depending on the shape and size and the position of a recognition point of chip 14 and bonding position 22a which are imaging targets. In such a case, by moving upper left capture 41, lower left capture 42, upper right capture 43, and lower right capture 44 relatively to upper left prism 45, lower left prism 47, upper right prism 46, and lower right prism 48 by capture moving mechanism 35, the position of the imaging visual fields of each capture is adjusted.

Here, as illustrated in FIG. 8, a positional relationship in which the visual field (upper left image UL) of upper left capture 41 in chip 14 and the visual field (lower left image DL) of lower left capture 42 in bonding position 22a vertically overlap each other is achieved. In addition, similarly, a positional relationship in which the visual field (upper right image UR) of upper right capture 43 in chip 14 and the visual field (lower right image DR) of lower right capture 44 in bonding position 22a vertically overlap each other is achieved.

As described above, in the configuration of capture moving mechanism 35, upper left capture 41, lower left capture 42, upper right capture 43, and lower right capture 44 move only by the same distance in the same direction in the X direction by the first moving mechanism. In addition, by the second moving mechanism, upper left capture 41 and upper right capture 43 are moved by the same distance in the same direction, and lower left capture 42 and the lower right capture 44 can be moved only by the same distance in the direction opposite to upper left capture 41 and upper right capture 43.

By moving upper left capture 41, upper right capture 43, lower left capture 42, and lower right capture 44 under such conditions, capture moving mechanism 35 can move upper left capture 41, lower left capture 42, upper right capture 43, and lower right capture 44 while maintaining a state where the visual field of upper left capture 41 and the visual field of lower left capture 42 overlap each other and a state where the visual field of upper right capture 43 and the visual field of lower right capture 44 overlap each other. Accordingly, it becomes possible to adjust the position of the imaging visual field of each capture in a state where the positional relationship of four partial images obtained by dividing each of the two upper and lower imaging targets of chip 14 and bonding position 22a is correctly maintained. When the configuration element used for imaging chip 14 and bonding position 22a which are described above is divided for each imaging target, a first combination of upper left prism 45 and upper left capture 41 or a third combination of upper right prism 46 and upper right capture 43 configures the first capture which images the image of chip 14 emitted from first emission port 63 of movable prism 32a. In addition, a second combination of lower left prism 47 and lower left capture 42 or a fourth combination of lower right prism 48 and lower right capture 44 configures the second capture which images the image of bonding position 22a emitted from second emission port 64 of movable prism 32a.

In addition, in the first capture and the second capture, only any one of the two combinations may be used, or both may be used. Similar to a case where the first combination is used as the first capture and the second combination is used as the second capture, for example, a case where only one combination is used means a case where only a partial image of one side of the imaging visual field is imaged.

In other words, in a case where the recognition in which the bonding target is small chip 14 during the bonding operation is sufficient with one-point recognition of the center of the chip, only the capture on one side is used. Meanwhile, in the recognition in which the bonding target is large chip 14 during the bonding operation, in a case where it is necessary to recognize two points, such as diagonal positions of the chip, both the above-described two combinations are used. In other words, each of both chip 14 and bonding position 22a is imaged by the two captures. In this manner, in bonding apparatus 1 described in the embodiment, it is possible to correspond to chips of various types from small chips to large chips, and a bonding apparatus having excellent versatility is realized.

Then, based on the image of chip 14 imaged by the above-described first capture and the image of bonding position 22a imaged by second capture, the relative positional deviation between chip 14 and bonding position 22a is detected by the image recognition. The positional deviation detection by the image recognition is executed by a processing function of image recognizer 93 (FIG. 13) provided in controller 5. Therefore, image recognizer 93 of controller 5 is a detector that detects the relative positional deviation between chip 14 and bonding position 22a based on the image of chip 14 and the image of bonding position 22a.

Based on the relative positional deviation between chip 14 and bonding position 22a detected by the detector in this manner, alignment processor 92 (FIG. 13) of controller 5 controls second XY table 20. Accordingly, bonding tool 29 that holds chip 14 and board holding stage 21 that holds board 22 are relatively moved to perform alignment processing for aligning chip 14 with bonding position 22a. Therefore, alignment processor 92 of controller 5 configures an aligner that relatively moves bonding tool 29 and board holding stage 21.

The definition of the capture in bonding apparatus 1 can be a plurality of definitions, and the definitions illustrated hereinafter may be used. In other words, the combination of upper left prism 45 and upper left capture 41 is defined as the first capture which images the first partial image (upper left image UL) which is a part of the image of chip 14 emitted from first emission port 63. The combination of lower left prism 47 and lower left capture 42 is defined as the second capture which images the second partial image (lower left image DL) which is a part that corresponds to the first partial image (upper left image UL) of the image of bonding position 22a emitted from second emission port 64.

In addition, the combination of upper right prism 46 and upper right capture 43 is defined as the third capture which images the third partial image (upper right image UR) which is a part different from the first partial image (upper left image UL) of the image of chip 14 emitted from first emission port 63. The combination of lower right prism 48 and lower right capture 44 is defined as the fourth capture which images a fourth partial image (lower right image DR) which is a part that corresponds to the third partial image (upper right image UR) of the image of bonding position 22a emitted from second emission port 64.

In addition, based on the first partial image (upper left image UL) imaged by the above-described first capture, the second partial image (lower left image DL) imaged by the second capture, the third partial image (upper right image UR) imaged by the third capture, and the fourth partial image (lower right image DR) imaged by the fourth capture, the relative positional deviation between chip 14 and bonding position 22a is detected by the above-described detector. In addition, based on the relative positional deviation between chip 14 and bonding position 22a detected by the detector in this manner, by relatively moving bonding tool 29 and board holding stage 21 by the above-described aligner, alignment processing for aligning chip 14 with bonding position 22a is performed.

Figure 10:
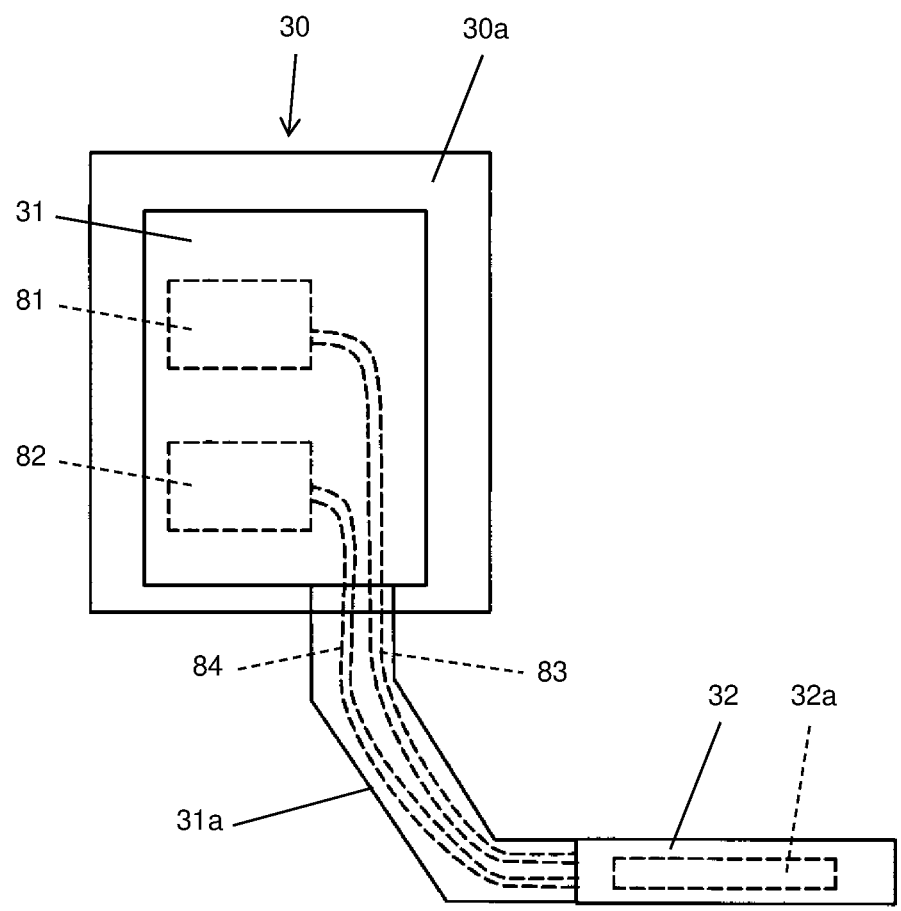
FIG. 10 is a configuration explanatory view of an optical head of the bonding apparatus according to the embodiment of the disclosure.

Next, the configuration of optical head 30 will be described with reference to FIG. 10. In FIG. 10, light source box 31 is installed on second moving base 30a that moves along guide rail 25 (refer to FIG. 2). Second moving base 30a moves in the Y direction by the mover described in FIG. 2. In light source box 31, upper light source 81 and lower light source 82 which configure upper illuminator 85 and lower illuminator 86, which are illustrated in FIG. 11, are stored.

From upper light source 81 and lower light source 82, upper optical fiber cable 83 and lower optical fiber cable 84 which are configured by bundling a plurality of optical fibers, respectively, extend. Upper optical fiber cable 83 and lower optical fiber cable 84 are connected to movable optical unit 32 via the inside of arm 31a. By operating upper light source 81 and lower light source 82, the illumination light is emitted inside movable optical unit 32 via upper optical fiber cable 83 and lower optical fiber cable 84.

Figure 11:
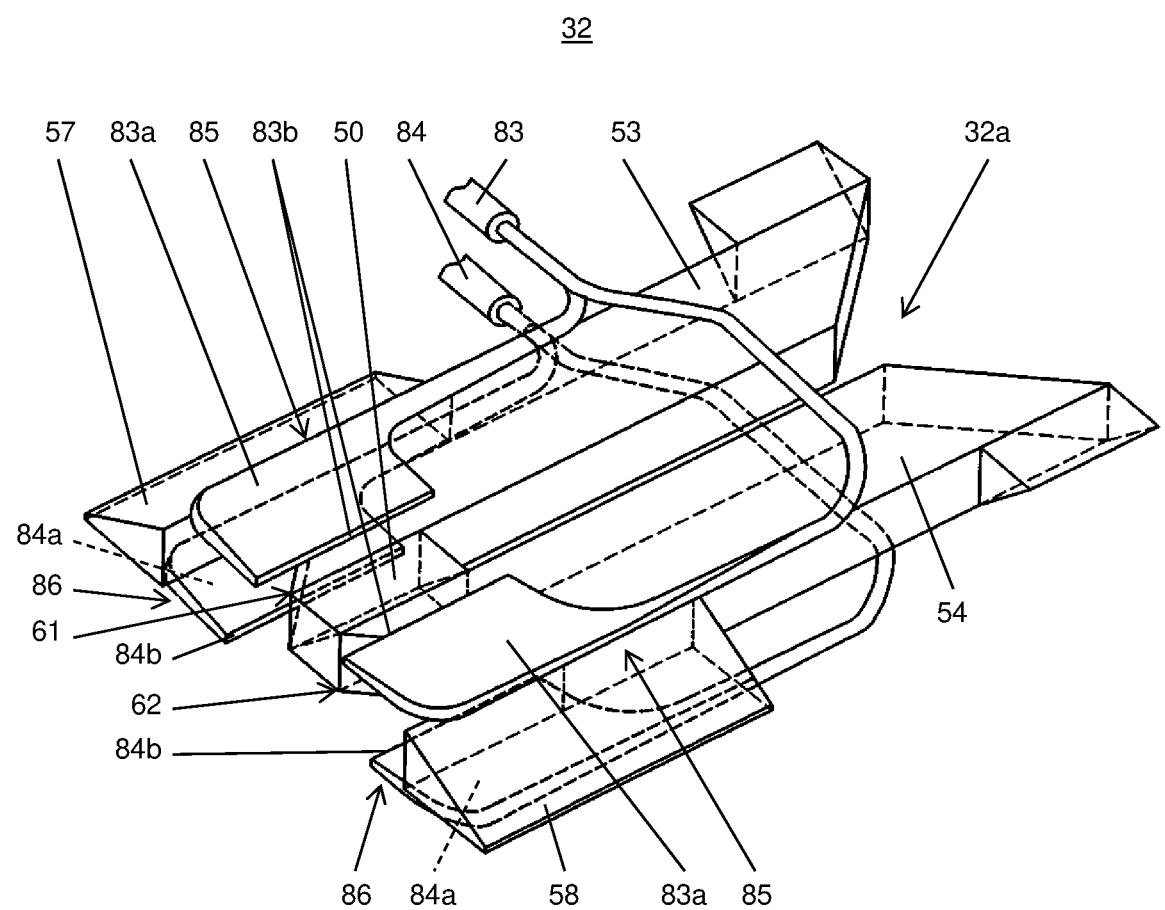
FIG. 11 is a configuration explanatory view of an upper illuminator and a lower illuminator provided in the movable light guide in the bonding apparatus according to the embodiment of the disclosure.

FIG. 11 illustrates movable prism 32a stored inside movable optical unit 32, and upper illuminator 85 and lower illuminator 86 provided with movable prism 32a. Upper illuminator 85 is provided on the upper surface side of movable prism 32a which is a movable light guide, and lower illuminator 86 is provided on the lower surface side of movable prism 32a. Both upper illuminator 85 and lower illuminator 86 move together with movable prism 32a by the above-described mover (linear motor 24 and guide rail 25). Upper illuminator 85 illuminates chip 14 when movable prism 32a is positioned between chip 14 and board 22. In addition, lower illuminator 86 illuminates board 22 when movable prism 32a is positioned between chip 14 and board 22.

Upper optical fiber cable 83 and lower optical fiber cable 84 form irradiators 83a and 84a in which a bundle of optical fibers is disentangled inside movable optical unit 32 to form the terminal end to be flat and the end surface is aligned linearly. The end surfaces opened by the distal end surface of the optical fiber that configures upper optical fiber cable 83 and lower optical fiber cable 84 are upper light generator 83b and lower light generator 84b which emit the illumination light generated by each of upper light source 81 and lower light source 82 and guided by upper optical fiber cable 83 and lower optical fiber cable 84 to the upper surface and the lower surface of reflector 50.

In other words, upper illuminator 85 includes upper light source 81 and upper optical fiber cable 83 which is a bundle of the plurality of optical fibers and guides the light of upper light source 81 to chip 14. In addition, lower illuminator 86 is configured to have lower light source 82 and lower optical fiber cable 84 which is a bundle of the plurality of optical fibers and guides the light of lower light source 82 to board 22.

In addition, the terminal end of upper optical fiber cable 83 is irradiator 83a formed to be flat such that the end surfaces of the plurality of optical fibers that configure upper optical fiber cable 83 surround first incident port 61 of the upper surface of reflector 50. Further, the terminal end of lower optical fiber cable 84 is irradiator 84a formed to be flat such that the end surface of the plurality of optical fibers that configure lower optical fiber cable 84 surrounds second incident port 62 of the lower surface of reflector 50.

On the outer surface of first block body 53 and second block body 54 that form movable prism 32a, at a position at which reflector 50 is sandwiched, seventh light guide 57 and eighth light guide 58 which are respectively light guides having a shape of a triangular prism extend outward and are provided integrally with movable prism 32a. When movable prism 32a is positioned between chip 14 and board 22, seventh light guide 57 and eighth light guide 58 provided sandwiching movable prism 32a have a function as a condenser which guides the illumination light irradiated downward from two different directions by the pair of spot illuminations 36 (refer to FIGS. 2 and 3) which are illuminators provided above to bonding position 22a of board 22.

Figure 12:
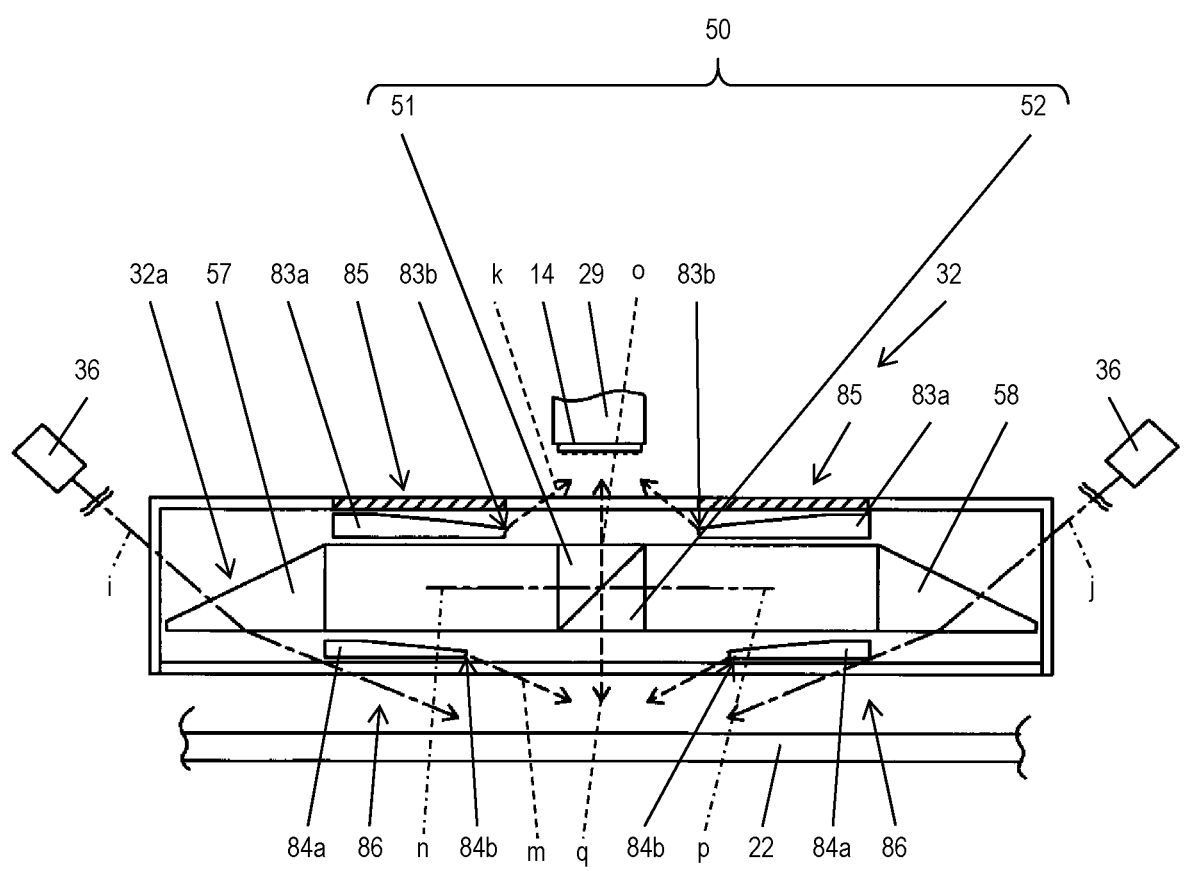
FIG. 12 is a sectional view of a movable optical unit in the bonding apparatus according to the embodiment of the disclosure.

FIG. 12 illustrates the illumination state of chip 14 and board 22 when imaging chip 14 and board 22 by positioning movable optical unit 32 between chip 14 held by bonding tool 29 and board 22. First, by operating spot illumination 36, the illumination light is emitted from two different directions obliquely upward to seventh light guide 57 and eighth light guide 58 from above both sides that sandwich movable optical unit 32 (arrows i and j). The irradiated illumination light is condensed by seventh light guide 57 and eighth light guide 58, and incident on bonding position 22a of the upper surface of board 22 to be illuminated.

Further, by operating upper illuminator 85 and lower illuminator 86, the illumination light is guided from upper light source 81 and lower light source 82 to irradiators 83a and 84a via upper optical fiber cable 83 and lower optical fiber cable 84. In addition, the illumination light is emitted as indirect illumination light respectively to chip 14 and board 22 from upper light generator 83b and lower light generator 84b (arrow k, arrow m). Furthermore, the illumination light from the same axis illumination provided for each capture is emitted to an imaging location.

In other words, the illumination light from the same axis illumination of upper left capture 41 or upper right capture 43 is incident on first light guide 51 of reflector 50 (arrow n), reflected upward by first reflection surface 71 (refer to FIG. 7), and incident on chip 14 from the same axis direction (arrow o). In addition, the illumination light from the same axis illumination of lower left capture 42 or lower right capture 44 is incident on second light guide 52 of reflector 50 (arrow p), reflected downward by fifth reflection surface 75 (refer to FIG. 7), and incident on board 22 from the same axis direction (arrow q).

In this manner, in bonding apparatus 1 of the embodiment, in a method of performing the imaging in the two vertical directions by positioning movable optical unit 32 incorporating movable prism 32a having the configuration illustrated in FIG. 7 between chip 14 and board 22, a plurality of illuminators which will be described hereinafter are provided.

First, the illumination light is emitted from the same axis direction to chip 14 and board 22 by the same axis illumination provided for each capture of imaging unit 34. In addition, as the indirect illumination for illuminating chip 14 and board 22 from the surroundings, upper illuminator 85 and lower illuminator 86 which are disposed on the upper and lower sides of movable prism 32a and emit the illumination light guided by the optical fiber cable are provided. Furthermore, the illumination light emitted downward by the pair of spot illuminations 36 provided above is condensed by seventh light guide 57 and eighth light guide 58, and illuminates bonding position 22a on the upper surface of board 22. By providing a plurality of illuminators in this manner, even in a case where there is an obstacle that interferes with normal illumination, such as a board holding member on board 22 which is the bonding target, it is possible to satisfy the necessary appropriate illumination conditions for excellent imaging.

Figure 13:
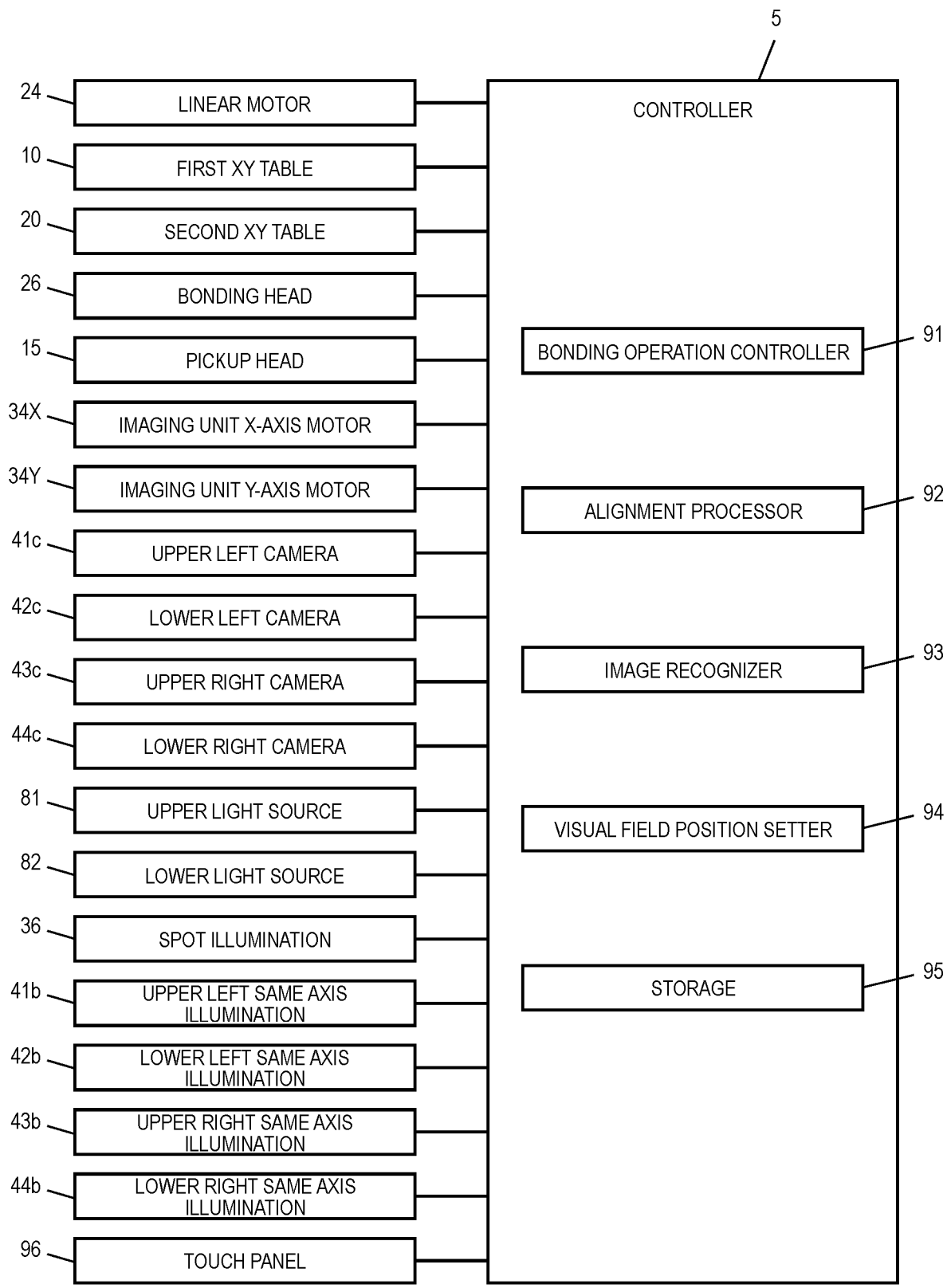
FIG. 13 is a block diagram illustrating a configuration of a control system of the bonding apparatus according to the embodiment of the disclosure.

Next, the configuration of a control system will be described with reference to FIG. 13. In FIG. 13, controller 5 includes bonding operation controller 91 that serves as an internal processing functioner, alignment processor 92, image recognizer 93, visual field position setter 94, and storage 95. In addition, linear motor 24, first XY table 10, second XY table 20, bonding head 26, pickup head 15, imaging unit X-axis motor 34X, imaging unit Y-axis motor 34Y, upper left camera 41c, lower left camera 42c, upper right camera 43c, lower right camera 44c, upper light source 81, lower light source 82, spot illumination 36, upper left same axis illumination 41b, lower left same axis illumination 42b, upper right same axis illumination 43b, lower right same axis illumination 44b, and touch panel 96 are connected to controller 5. Touch panel 96 displays a recognition screen by image recognizer 93, an operation screen for operation input or data input to controller 5, and the like.

By controlling linear motor 24, first XY table 10, second XY table 20, bonding head 26, and pickup head 15, bonding operation controller 91 controls the bonding operation of bonding chip 14 removed from chip supplier 2 by pickup head 15 to board 22 by bonding head 26.

By performing recognition processing of the image obtained by imaging chip 14 and bonding position 22a by upper left camera 41c, lower left camera 42c, upper right camera 43c, and lower right camera 44c, image recognizer 93 detects the positional deviation between chip 14 and bonding position 22a. In other words, image recognizer 93 is detection means for detecting the relative positional deviation between chip 14 and bonding position 22a. When the imaging is performed by upper left camera 41c, lower left camera 42c, upper right camera 43c, and lower right camera 44c, the lighting of upper light source 81, lower light source 82, spot illumination 36, upper left same axis illumination 41b, and lower left same axis illumination 42b, upper right same axis illumination 43b, and lower right same axis illumination 44b is controlled by an illumination control function of image recognizer 93.

Visual field position setter 94 moves imaging unit 34 by controlling the driving of imaging unit X-axis motor 34X and imaging unit Y-axis motor 34Y. Accordingly, the positions of the imaging visual fields of upper left capture 41, lower left capture 42, upper right capture 43, and lower right capture 44 are set in accordance with the imaging target. Storage 95 stores data, such as bonding data used for controlling the bonding operation by bonding operation controller 91, recognition data used for the recognition processing by image recognizer 93, and imaging visual field data used for setting the visual field position by visual field position setter 94.

As described above, in the embodiment, bonding apparatus 1 for bonding chip 14 held by bonding tool 29 to bonding position 22a of board 22 is configured to include: the movable light guide having a function of making the image of chip 14 and the image of bonding position 22a incident respectively from first incident port 61 and second incident port 62 and emitting the images upward from first emission port 63 and second emission port 64, when advancing between chip 14 and board 22; and imaging unit 34 which images the emitted image of the chip and the image of the bonding position by four captures via fixed optical unit 33 including four prisms that function as two-time reflection mirror, and movable prism 32a formed of a thin multi-surface reflection prism is used as the movable light guide. Accordingly, it is possible to realize high productivity while ensuring high position accuracy in the bonding work.

In addition, upper left image UL and upper right image UR of chip 14 emitted from first emission port 63 and lower left image DL and lower right image DR of chip 14 of bonding position 22a emitted from second emission port 64 are reflected downward by four prisms by fixed optical unit 33. In the configuration in which the reflected images are made incident on the four captures of imaging unit 34 and imaged, by moving the four captures relative to the four prisms of fixed optical unit 33 by capture moving means, the position of the imaging visual field is adjusted by the four captures. Accordingly, it is possible to target various types of chips 14 having different sizes or positions of recognition points. In bonding mechanism 4 of bonding apparatus 1 having the above-described configuration, bonding head 26 including bonding tool 29 and optical head 30 including movable optical unit 32 are installed on first moving base 26a and second moving base 30a which are driven by common linear motor 24 and move along guide rail 25. In a state where optical head 30 is moved and movable optical unit 32 is positioned between chip 14 and board 22, the image of chip 14 and the image of bonding position 22a are imaged by imaging unit 34. Accordingly, it becomes possible to simplify the mechanism of the bonding apparatus and to reduce equipment cost.

In movable prism 32a included in movable optical unit 32 described above, upper illuminator 85 which guides the illumination light from the upper light source to irradiator 83a by upper optical fiber cable 83, emits the illumination light from upper light generator 83b, and illuminates chip 14, and lower illuminator 86 which guides the illumination light from the lower light source to irradiator 84a by lower optical fiber cable 84, emits the illumination light from lower light generator 84b, and illuminates bonding position 22a of board 22 are provided. With this configuration, it becomes possible to illuminate chip 14 and bonding position 22a under the appropriate illumination conditions, and to perform the position recognition with high accuracy.

Furthermore, in the bonding apparatus 1 illustrated in the embodiment, the illumination light from the pair of spot illuminations 36 disposed in Y-axis frame 23 of bonding mechanism 4 is emitted to movable optical unit 32 positioned between chip 14 and board 22, and the illumination light is condensed by seventh light guide 57 and eighth light guide 58 provided on the side surface of movable prism 32a and guided to the bonding position of board 22. Accordingly, even in a case where the interference is present on board 22, it is possible to illuminate bonding position 22a of board 22 under the appropriate illumination conditions.

In addition, in bonding apparatus 1 illustrated in the embodiment, the pair of spot illuminations 36 is disposed in Y-axis frame 23, but may be disposed in a member different from Y-axis frame 23.

The bonding apparatus of the disclosure has an effect that high productivity can be realized while ensuring high position accuracy, and is useful in the technical field of bonding the chip to the bonding position of the board.

What is claimed is:

1. A bonding apparatus in which a bonding tool holds a chip and the bonding tool is lowered in a direction of a stage on which a board is placed so as to oppose the chip to bond the chip to a bonding position of the board, the bonding apparatus comprising:
    a movable light guide configured to
        receive an image of the chip incident from a first incident port that opposes the chip and emits the image of the chip upward from a first emission port separated from the first incident port in a horizontal direction, and
        receive an image of the bonding position of the board incident from a second incident port that opposes the bonding position and emits the image of the bonding position upward from a second emission port separated from the second incident port in the horizontal direction, when being positioned between the chip positioned above the bonding position and the board;
    a first capture which images the image of the chip emitted from the first emission port;
    a second capture which images the image of the bonding position emitted from the second emission port;
    a detector which detects a relative positional deviation of the chip and the bonding position based on the image of the chip imaged by the first capture and the image of the bonding position imaged by the second capture;
    an aligner which relatively moves the bonding tool and the stage based on the relative positional deviation detected by the detector; and
    a mover which advances and retreats the movable light guide to a space between the chip positioned above the bonding position and the board,
    wherein the first emission port of the movable light guide reflects the image of the chip upward, and the second emission port of the movable light guide reflects the image of the bonding position of the board upward.

2. The bonding apparatus of claim 1,
    wherein the movable light guide includes
        a reflector which reflects the image of the chip incident from the first incident port in a first horizontal direction and reflects the image of the bonding position incident from the second incident port in a second horizontal direction opposite to the first horizontal direction,
        a plurality of chip image reflection surfaces which guide the image of the chip reflected in the first horizontal direction to the first emission port, and
        a plurality of board image reflection surfaces which guide the image of the bonding position reflected in the second horizontal direction to the second emission port.

3. The bonding apparatus of claim 2,
    wherein the plurality of chip image reflection surfaces include
        a first final reflection surface which is disposed immediately below the first emission port and reflects the image of the chip incident horizontally immediately above the image of the chip, and
        at least one first upright reflection surface that guides the image of the chip reflected in the first horizontal direction to the first final reflection surface, and
    wherein the plurality of board image reflection surfaces include
        a second final reflection surface which is disposed immediately below the second emission port and reflects the image of the bonding position incident horizontally immediately above the image of the bonding position, and
        at least one second upright reflection surface that guides the image of the bonding position reflected in the second horizontal direction to the second final reflection surface.

4. The bonding apparatus of claim 3,
    wherein the first final reflection surface and the second final reflection surface, and the at least one first upright reflection surface and the at least one second upright reflection surface pass through a center of the reflector and are axisymmetrical to a straight line orthogonal to the first horizontal direction and the second horizontal direction within a horizontal surface.

5. The bonding apparatus of claim 1, wherein the movable light guide comprises two symmetrical cubic bodies including one cubic body for conveying the image of the chip and the other cubic body for conveying the image of the bonding position.

6. The bonding apparatus of claim 1, wherein the aligner and the mover slide on a same guide rail.

7. A bonding apparatus in which a bonding tool holds a chip and the bonding tool is lowered in a direction of a stage on which a board is placed so as to oppose the chip to bond the chip to a bonding position of the board, the bonding apparatus comprising:
    a movable light guide which makes an image of the chip incident from a first incident port that opposes the chip and emits the image of the chip upward from a first emission port separated from the first incident port in a horizontal direction, and makes an image of the bonding position of the board incident from a second incident port that opposes the bonding position and emits the image of the bonding position upward from a second emission port separated from the second incident port in the horizontal direction, when being positioned between the chip positioned above the bonding position and the board;
    a first capture which images a first partial image which is a part of the image of the chip emitted from the first emission port;
    a second capture which images a second partial image which is a part that corresponds to the first partial image in the image of the bonding position emitted from the second emission port;
    a third capture which images a third partial image which is a part different from the first partial image in the image of the chip emitted from the first emission port;
    a fourth capture which images a fourth partial image which is a part that corresponds to the third partial image in the image of the bonding position emitted from the second emission port;
    a detector which detects a relative positional deviation of the chip and the bonding position based on the first partial image imaged by the first capture, the second partial image imaged by the second capture, the third partial image imaged by the third capture, and the fourth partial image imaged by the fourth capture;

an aligner which relatively moves the bonding tool and the stage based on the relative positional deviation detected by the detector; and a mover which advances and retreats the movable light guide to a space between the chip positioned above the bonding position and the board.

8. The bonding apparatus of claim 5,
wherein the movable light guide includes
- a reflector which reflects the image of the chip incident from the first incident port in a first horizontal direction and reflects the image of the bonding position incident from the second incident port in a second horizontal direction opposite to the first horizontal direction,
- a plurality of chip image reflection surfaces which guide the image of the chip reflected in the first horizontal direction to the first emission port, and
- a plurality of board image reflection surfaces which guide the image of the bonding position reflected in the second horizontal direction to the second emission port.

9. The bonding apparatus of claim 8,
wherein the plurality of chip image reflection surfaces include
- a first final reflection surface which is disposed immediately below the first emission port and reflects the image of the chip incident horizontally immediately above the image of the chip, and
- at least one first upright reflection surface that guides the image of the chip reflected in the first horizontal direction to the first final reflection surface, and wherein the plurality of board image reflection surfaces include
- a second final reflection surface which is disposed immediately below the second emission port and reflects the image of the bonding position incident horizontally immediately above the image of the bonding position, and
- at least one second upright reflection surface that guides the image of the bonding position reflected in the second horizontal direction to the second final reflection surface.

10. The bonding apparatus of claim 9,
wherein the first final reflection surface and the second final reflection surface, and the at least one first upright reflection surface and the at least one second upright reflection surface pass through a center of the reflector and are axisymmetrical to a straight line orthogonal to the first horizontal direction and the second horizontal direction within a horizontal surface.

* * * * *